United States Patent
Jang et al.

(10) Patent No.: US 9,627,207 B2
(45) Date of Patent: Apr. 18, 2017

(54) METHODS OF FORMING SEMICONDUCTOR DEVICE HAVING GATE ELECTRODE

(71) Applicants: Sunguk Jang, Seoul (KR); Juyeon Kim, Seoul (KR); Hosung Son, Hwaseong-si (KR); Dongsuk Shin, Yongin-si (KR); Jeongmin Lee, Suwon-si (KR)

(72) Inventors: Sunguk Jang, Seoul (KR); Juyeon Kim, Seoul (KR); Hosung Son, Hwaseong-si (KR); Dongsuk Shin, Yongin-si (KR); Jeongmin Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/736,320

(22) Filed: Jun. 11, 2015

(65) Prior Publication Data

US 2016/0133728 A1    May 12, 2016

(30) Foreign Application Priority Data

Nov. 7, 2014   (KR) .................. 10-2014-0154594

(51) Int. Cl.
*H01L 21/225* (2006.01)
*H01L 29/66* (2006.01)
*H01L 29/78* (2006.01)
*H01L 29/417* (2006.01)

(52) U.S. Cl.
CPC .... *H01L 21/2253* (2013.01); *H01L 29/66545* (2013.01); *H01L 29/66795* (2013.01); *H01L 29/785* (2013.01); *H01L 29/7848* (2013.01); *H01L 29/41791* (2013.01); *H01L 29/7854* (2013.01)

(58) Field of Classification Search
CPC .......... H01L 29/66795; H01L 29/6656; H01L 29/66545; H01L 29/66803; H01L 29/785; H01L 29/4191
USPC .................................................. 438/149, 283
See application file for complete search history.

(56) References Cited

U.S. PATENT DOCUMENTS

| | | |
|---|---|---|
| 6,284,626 B1 | 9/2001 | Kim |
| 6,440,807 B1 | 8/2002 | Ajmera et al. |
| 7,449,373 B2 | 11/2008 | Doyle et al. |
| 8,691,642 B2 | 4/2014 | Lee et al. |
| 2001/0024858 A1* | 9/2001 | Schulz .............. H01L 29/66666 438/268 |

(Continued)

FOREIGN PATENT DOCUMENTS

| | | |
|---|---|---|
| KR | 10-0811259 | 2/2008 |
| KR | 10-2012-0032792 | 4/2012 |

*Primary Examiner* — Brook Kebede
(74) *Attorney, Agent, or Firm* — Myers Bigel, P.A.

(57) ABSTRACT

Methods of forming a semiconductor device are provided. An active region is formed on a substrate. A temporary gate crossing the active region and a capping pattern covering the temporary gate are formed. Spacers are formed on sidewalls of the temporary gate. A growth-blocking layer is locally formed in an upper edge of the temporary gate. A source/drain region is formed on the active region adjacent to the temporary gate. The capping pattern, the first growth-blocking layer, and the temporary gate are removed to expose the active region. A gate electrode is formed on the exposed active region.

20 Claims, 22 Drawing Sheets

(56) References Cited

U.S. PATENT DOCUMENTS

| | | | |
|---|---|---|---|
| 2012/0168829 A1* | 7/2012 | Zhong | H01L 29/4983 257/288 |
| 2013/0001698 A1 | 1/2013 | Waite et al. | |
| 2013/0052779 A1 | 2/2013 | Flachowsky et al. | |
| 2014/0057405 A1 | 2/2014 | Zhou et al. | |
| 2015/0357440 A1* | 12/2015 | Cheng | H01L 29/66795 257/401 |

* cited by examiner

ND ELECTRODE

CROSS-REFERENCE TO RELATED APPLICATION

This application claims priority under 35 U.S.C. §119 to Korean Patent Application No. 10-2014-0154594 filed on Nov. 7, 2014, the disclosure of which is hereby incorporated by reference in its entirety.

FIELD

Embodiments of the inventive concept relate to methods of forming a semiconductor device having a gate electrode.

BACKGROUND

Sizes and design rules of semiconductor devices have been gradually decreased. Accordingly, defects in the semiconductor device may be generated during a process of forming a semiconductor device. Various studies are being executed in order to form a semiconductor device capable of preventing defect generation, advantageous for high integration, and showing excellent performance.

SUMMARY

Embodiments of the inventive concept provide methods of forming a semiconductor device capable of improving quality and yield.

The technical aspects of the inventive concept are not limited to the above disclosure; other aspects may become apparent to those of ordinary skill in the art based on the following descriptions.

In accordance with some embodiments of the inventive concept, a method of forming a semiconductor device includes forming an active region on a substrate, forming a temporary gate crossing the active region and a capping pattern on the temporary gate, forming spacers on sidewalls of the temporary gate, forming a first growth-blocking layer locally in an upper edge of the temporary gate, forming a source/drain region on the active region adjacent to the temporary gate, removing the capping pattern, the first growth-blocking layer, and the temporary gate to expose the active region, and forming a gate electrode on the exposed active region.

In some embodiments, the first growth-blocking layer may be locally formed in the upper edge of an ending portion of the temporary gate disposed in a direction in which the temporary gate crosses the active region.

In some embodiments, the forming of the first growth-blocking layer may include implanting dopants in the temporary gate, the temporary gate includes polysilicon, and the dopants include As, N, C, O, or a combination thereof.

In some embodiments, the tilted ion-implantation process may be performed by implanting dopants into the temporary gate at an angle which includes a horizontal angle in a range of 80 to 89 degrees, 91 to 100 degrees, 260 to 269 degrees, 271 to 280 degrees, or a combination thereof with respect to a horizontal longitudinal axis of the temporary gate and a vertical angle in a range of 30 to 89 degrees with respect to a line perpendicular to a surface of the substrate.

In some embodiments, the forming of the first growth-blocking layer may include forming a recessed region by partially removing the active region after forming the spacers and implanting dopants into the temporary gate using a tilted ion-implantation process.

In some embodiments, a second growth-blocking layer may be formed in an upper portion of the temporary gate.

In some embodiments, the first growth-blocking layer may be in contact with a sidewall of the second growth-blocking layer.

In some embodiments, the first growth-blocking layer may surround sidewalls of the second growth-blocking layer.

In some embodiments, a lower end of the first growth-blocking layer may be disposed at a lower level than a lower end of the second growth-blocking layer.

In some embodiments, the forming of the second growth-blocking layer may include forming a temporary gate layer on the active region, forming the second growth-blocking layer in an upper portion of the temporary gate layer using an ion-implantation process, forming a capping pattern on the second growth-blocking layer, and patterning the temporary gate layer to form the temporary gate. The second growth-blocking layer may remain between the capping pattern and the temporary gate.

In some embodiments, the temporary gate may include polysilicon and the second growth-blocking layer may include dopants implanted into the temporary gate including the polysilicon. The dopants may include As, N, C, O, or a combination thereof.

In some embodiments, the forming of the source/drain region may include partially removing the active region to form a recessed region by partially removing the active region before forming the first growth-blocking layer and forming the source/drain region in the recessed region after forming the first growth-blocking layer.

In some embodiments, the source/drain region may include a crystal growth material.

In some embodiments, the source/drain region may include SiGe, Si, SiC, or a combination thereof that is formed using a selective epitaxial growth (SEG).

In some embodiments, an upper end of the source/drain may protrude at a higher level than an upper end of the active region.

In some embodiments, a gate dielectric layer may be formed between the active region and the gate electrode. The gate dielectric layer may surround a bottom surface and sidewalls of the gate electrode.

In accordance with some embodiments of the inventive concept, a method of forming a semiconductor device includes defining a fin active region on a substrate, forming a temporary gate covering an upper surface and sidewalls of the fin active region, forming a first growth-blocking layer in an upper portion of the temporary gate, forming a capping pattern on the first growth-blocking layer, forming spacers on sidewalls of the temporary gate and the first growth-blocking layer, forming source/drain regions on the fin active region disposed adjacent to the sidewalls of the temporary gate, removing the capping pattern, the first growth-blocking layer, and the temporary gate to expose the fin active region, and forming a gate electrode on the exposed fin active region.

In some embodiments, a second growth-blocking layer may be formed in an edge of the first growth-blocking layer.

In some embodiments, the second growth-blocking layer may be formed in an upper corner of the temporary gate.

In accordance with some embodiments of the inventive concept, a method of forming a semiconductor device includes defining a fin active region on a substrate, forming a temporary gate layer covering an upper surface and sidewalls of the fin active region, forming a first growth-blocking layer in an upper portion of the temporary gate layer, forming a capping pattern on the first growth-blocking layer, forming a temporary gate by patterning the temporary gate layer. The first growth-blocking layer remains between the capping pattern and the temporary gate. The method includes forming spacers on sidewalls of the temporary gate and the first growth-blocking layer, forming a recessed region by partially removing the fin active region, forming a second growth-blocking layer in an upper edge of the temporary gate and the first growth-blocking layer, forming a source/drain region in the recessed region, removing the capping pattern, the first growth-blocking layer, the second growth-blocking layer and the temporary gate to expose the fin active region, and forming a gate electrode on the exposed fin active region.

Details of other embodiments are included in the detailed description and drawings.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference numerals denote the same respective parts throughout the different views. The drawings are not necessarily to scale, emphasis instead being placed upon illustrating the principles of the inventive concept. In the drawings.

DETAILED DESCRIPTION OF THE EMBODIMENTS

Figure 1:
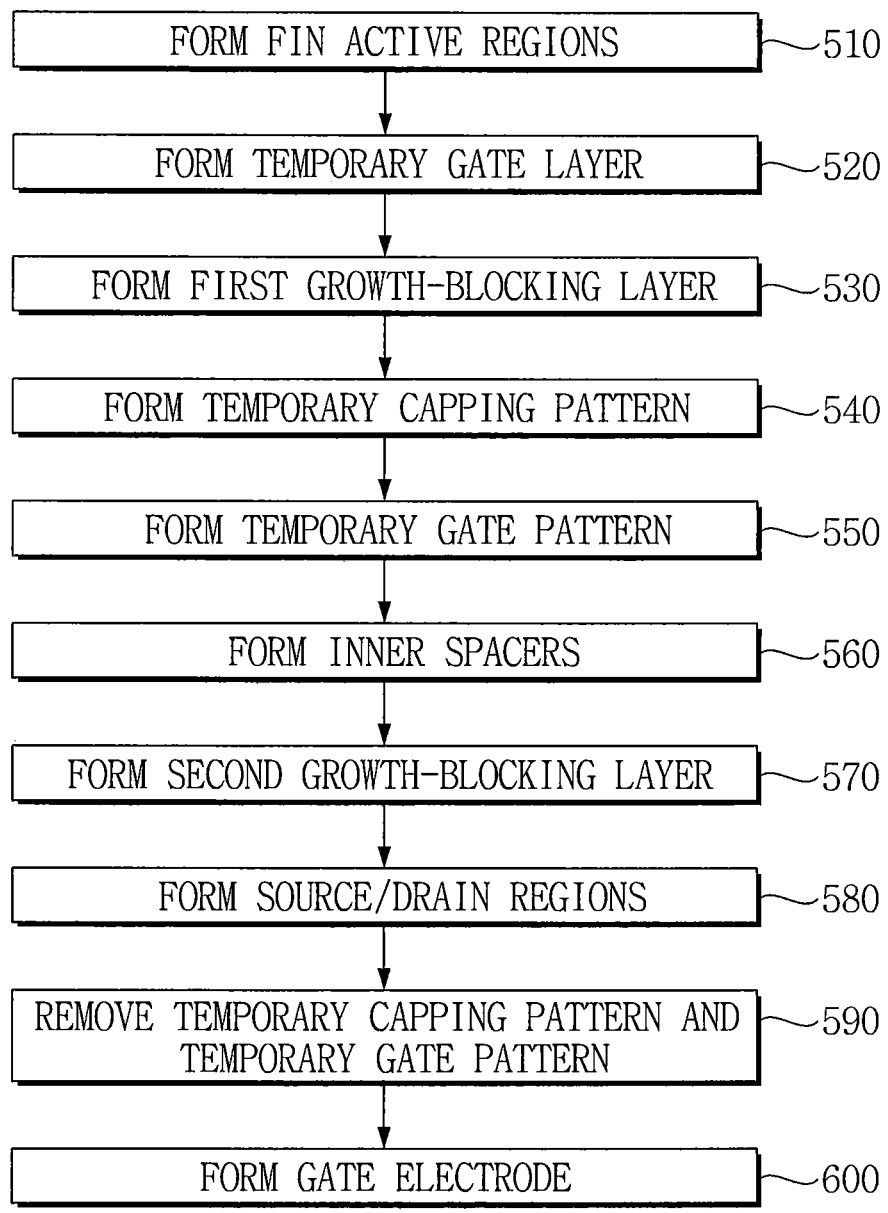
FIG. 1 is a flowchart illustrating a method of forming a semiconductor device in accordance with some embodiments of the inventive concept.

Various embodiments will now be described more fully with reference to the accompanying drawings in which some embodiments are shown. The inventive concept may, however, be embodied in different forms and should not be construed as limited to the embodiments set forth herein. Rather, these embodiments are provided so that this disclosure is thorough and complete and fully conveys the inventive concept to those skilled in the art.

The terminology used herein to describe embodiments of the inventive concept is not intended to limit the scope of the invention. The articles "a," "an," and "the" are singular in that they have a single referent; however, the use of the singular form in this specification should not preclude the presence of more than one referent. In other words, elements of this specification referred to in the singular form may number one or more, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout this specification.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional and/or planar illustrations that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region or an etched region illustrated as a rectangle will, typically, have rounded or curved features.

Like numerals refer to like elements throughout the specification. Accordingly, the same numerals and similar numerals can be described with reference to other drawings, even if not specifically described in a corresponding drawing. Further, when a numeral is not marked in a drawing, the numeral can be described with reference to other drawings.

FIG. 1 is a flowchart illustrating a method of forming a semiconductor device in accordance with some embodiments of the inventive concept.

Referring to FIG. 1, the method of forming a semiconductor device in accordance with some embodiments of the inventive concept may include forming fin active regions (510), forming a temporary gate layer (520), forming a first growth-blocking layer (530), forming a temporary capping pattern (540), forming a temporary gate pattern (550), forming inner spacers (560), forming a second growth-blocking layer (570), forming a source/drain regions (580), removing the temporary capping pattern and the temporary gate pattern (590), and forming a gate electrode (600). While the source/drain is formed, the first growth-blocking layer and the second growth-blocking layer may reduce or possibly prevent defects such as nodules on the temporary gate pattern. Accordingly, quality and yield of the semiconductor device in accordance with some embodiments of the inventive concept may be improved. Hereinafter, the method of forming a semiconductor device will be described in detail with reference to a layout, cross-sectional views, and perspective views.

Figure 2:
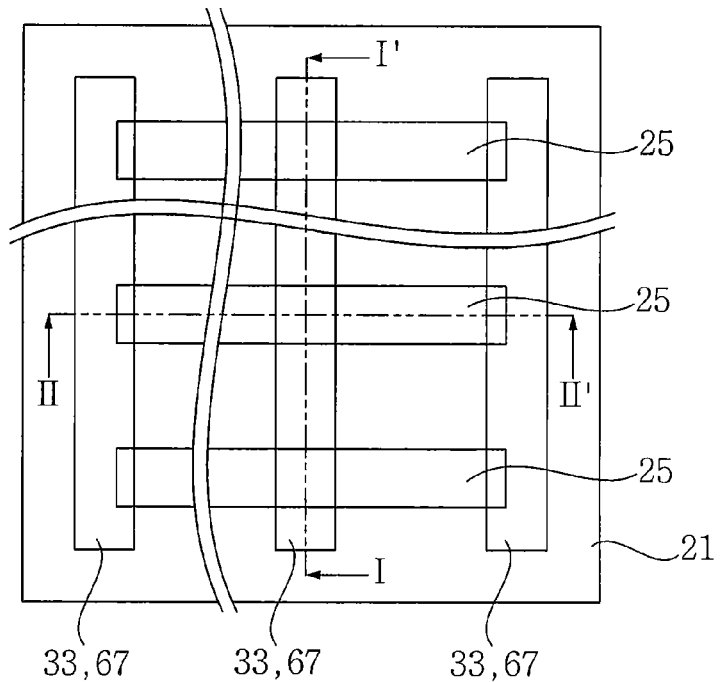
FIGS. 2 and 11A are layouts for describing a method of forming a semiconductor device in accordance with some embodiments of the inventive concept.
Figure 10A:
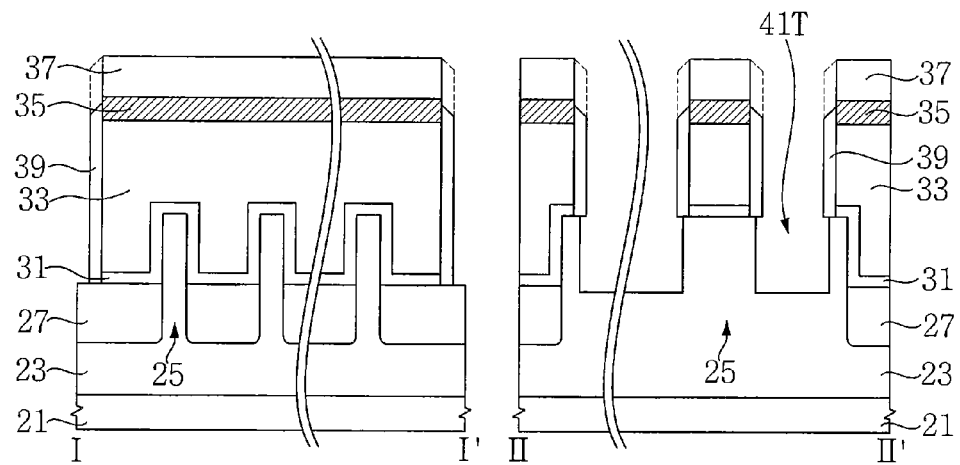
Figure 10B:
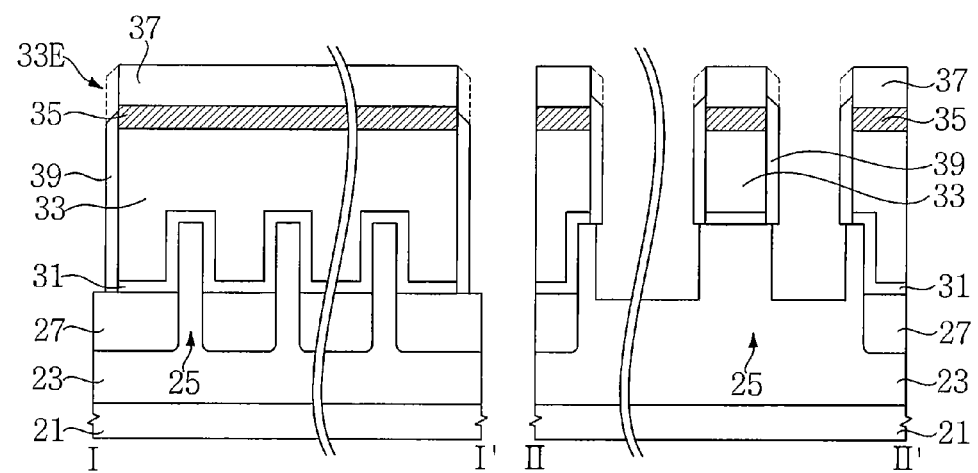
Figure 10C:
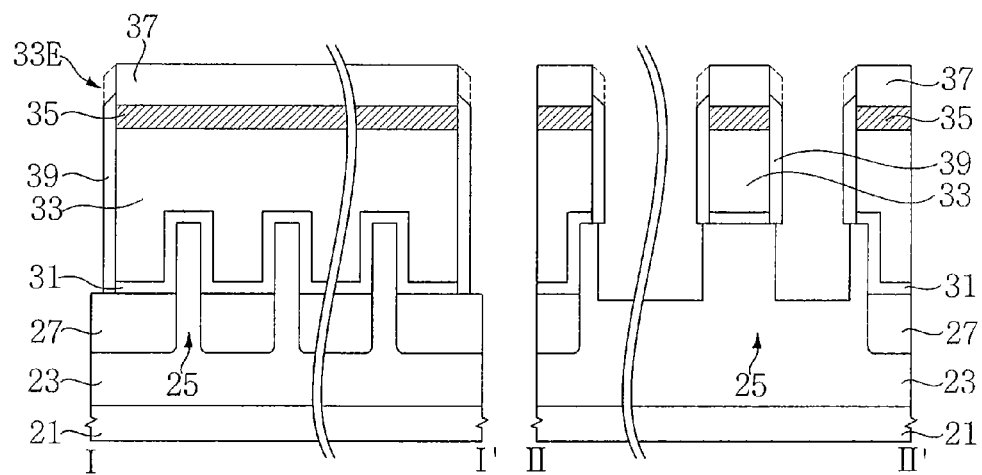
Figure 11A:
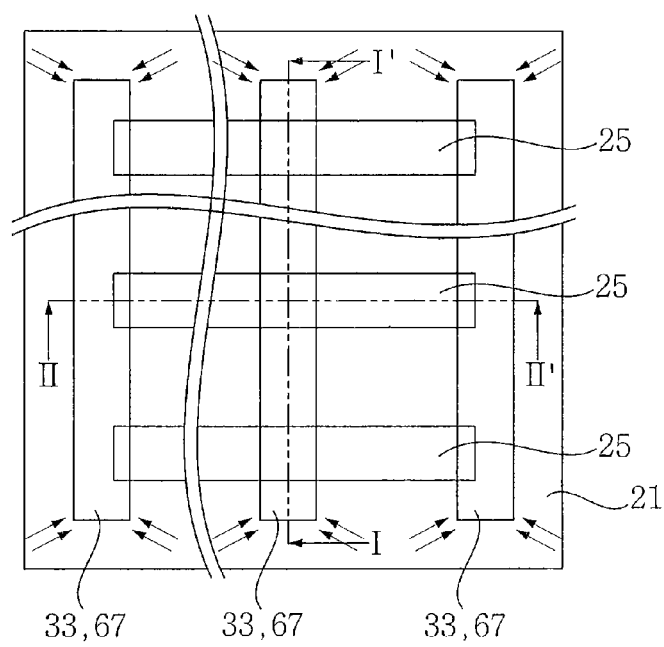
Figure 11B:
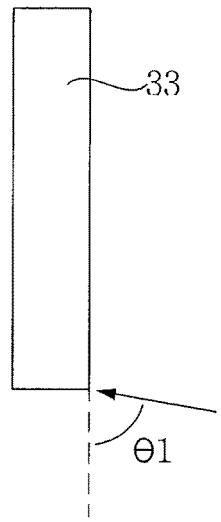
FIG. 11B is an enlarged view illustrating a portion of FIG. 11A.
Figure 11C:
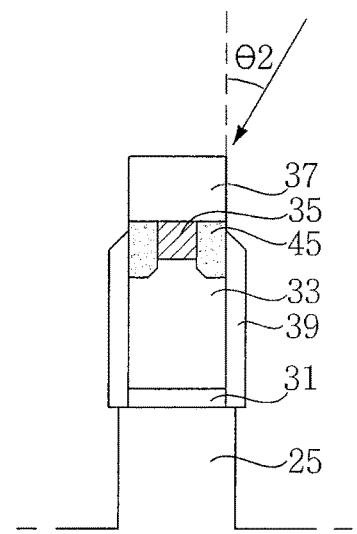
FIG. 11C is a cross-sectional view illustrating a portion of FIG. 11A.
Figure 11D:
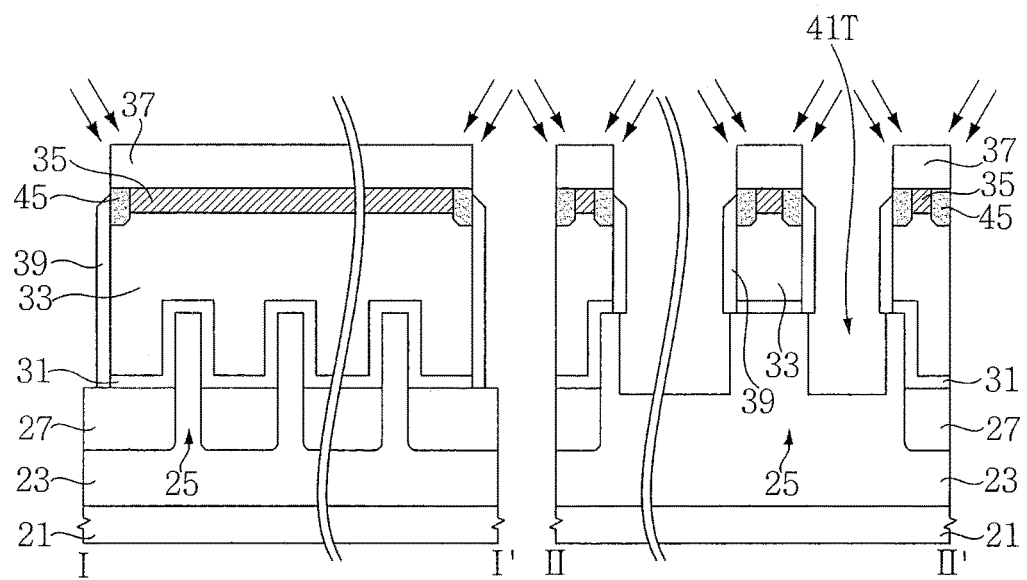

FIGS. 2 and 11A are layouts for describing a method of forming a semiconductor device in accordance with some embodiments of the inventive concept, and FIGS. 3 to 9, 10A, 10B, 10C, 11D, 11E, 11F, and 12 to 17 are cross-sectional views taken along the lines I-I' and II-II' of FIG. 2. FIG. 11B is an enlarged view illustrating a portion of FIG. 11A, FIG. 11C is a cross-sectional view illustrating a portion of FIG. 11A, and FIGS. 11G, 11H and 11I are perspective views illustrating portions of FIG. 11A.

Figure 3:
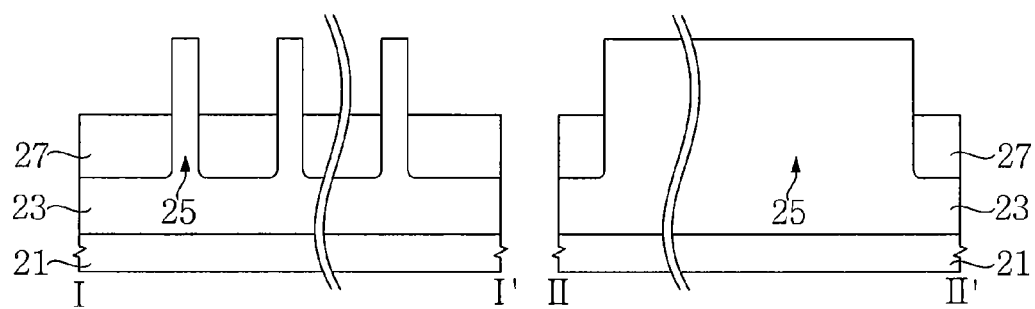
FIGS. 3 to 9, 10A, 10B, 10C, 11D, 11E, 11F and 12 to 17 are cross-sectional views illustrating a method of forming a semiconductor device in accordance with some embodiments of the inventive concept, which are taken along the lines I-I' and II-II' of FIG. 2.

Referring to FIGS. 1, 2 and 3, fin active regions 25 may be formed on a substrate 21 (510). A well 23 and device isolation layers 27 may be formed on a substrate 21.

The substrate 21 may be a semiconductor substrate such as a silicon bulk wafer or silicon on insulator (SOI) wafer. For example, the substrate 21 may be a single crystalline silicon wafer including p-type impurities. The p-type impurities may include B, BF, BF2, or a combination thereof. The well 23 may include n-type impurities. The n-type impurities may include P, As, or a combination thereof. The fin active regions 25 may be defined on the well 23 by the device isolation layers 27. For example, the fin active regions 25 may be single crystalline silicon. The fin active regions 25 may include n-type impurities. The fin active regions 25 may have a vertical height greater than a horizontal width thereof. The fin active regions 25 may protrude above the device isolation layers 27, and upper surfaces and sidewalls of the fin active regions 25 may be exposed between the device isolation layers 27. Each of the device isolation layers 27 may include, for example, silicon oxide, silicon nitride, silicon oxynitride, or a combination thereof.

In some embodiments, the well 23 may include p-type impurities. In some embodiments, the well 23 may be omitted. The fin active regions 25 may be single crystalline silicon including p-type impurities.

Figure 4:
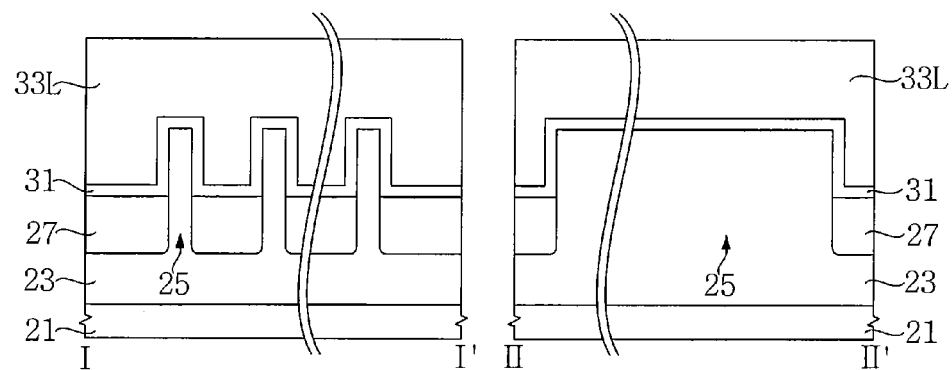

Referring to FIGS. 1, 2 and 4, a buffer layer 31 and a temporary gate layer 33L may be formed (520).

The buffer layer 31 may include silicon oxide. The buffer layer 31 may cover the upper and sidewalls of the fin active regions 25, and may also be formed on the device isolation layers 27. The temporary gate layer 33L may include a material having an etch selectivity with respect to the fin active regions 25. The temporary gate layer 33L may include polysilicon. The temporary gate layer 33L may be formed on the buffer layer 31. The temporary gate layer 33L may cover the upper and sidewalls of the fin active regions 25. A lower surface of temporary gate layer 33L on the device isolation layers 27 may be disposed at a lower level than the upper surfaces of the fin active regions 25. An upper surface of the temporary gate layer 33L may be planarized. A chemical mechanical polishing (CMP) process, an etch-back process, or a combination thereof may be applied to planarize of the temporary gate layer 33L.

Figure 5:
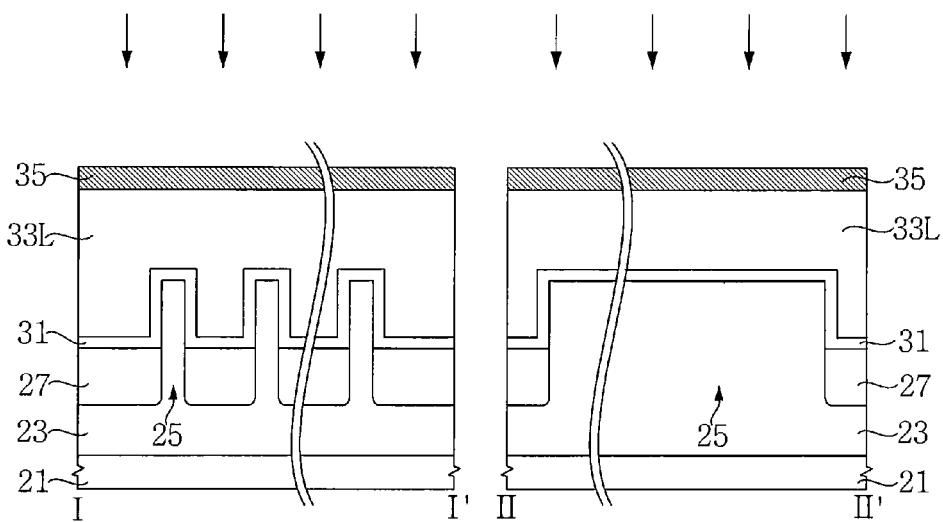

Referring to FIGS. 1, 2 and 5, a first growth-blocking layer 35 may be formed using a first ion-implantation process (530).

The first growth-blocking layer 35 may be formed by injecting dopants into the temporary gate layer 33L using the first ion-implantation process. The dopants may include As, N, C, O, or a combination thereof. The dopants may be implanted into the temporary gate layer 33L at a dose of about 1E13 to about 1E16 atoms/cm$^2$. The first growth-blocking layer 35 may be formed to be adjacent to the upper surface of the temporary gate layer 33L. For example, the dopants may be distributed from the upper surface of the temporary gate layer 33L to a depth of about 10 nm. The temporary gate layer 33L may remain below the first growth-blocking layer 35. The dopants may not be implanted into the fin active regions 25.

Figure 6:
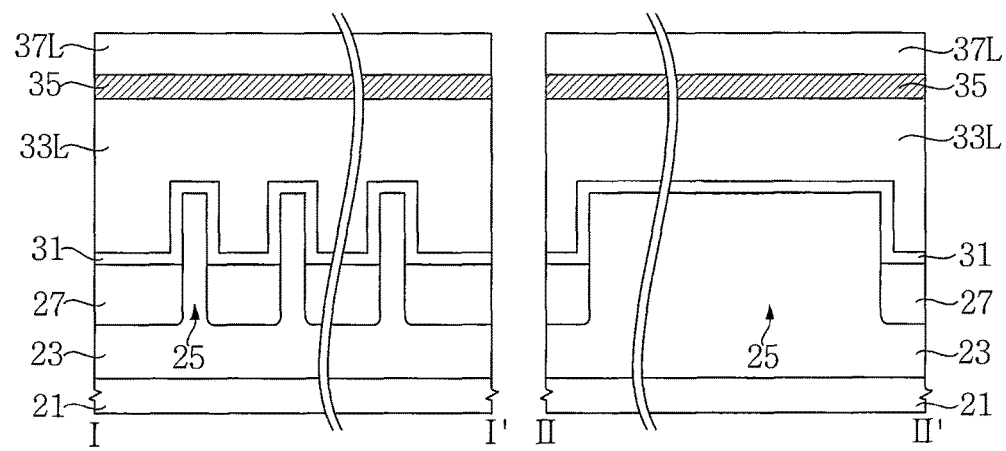

Referring to FIGS. 2 and 6, a temporary capping layer 37L may be formed.

The temporary capping layer 37L may cover the first growth-blocking layer 35. The temporary capping layer 37L may include, for example, silicon oxide, silicon nitride, silicon oxynitride, or a combination thereof. The temporary capping layer 37L may include a material having an etch selectivity with respect to the first growth-blocking layer 35 and the temporary gate layer 33L.

Figure 7:
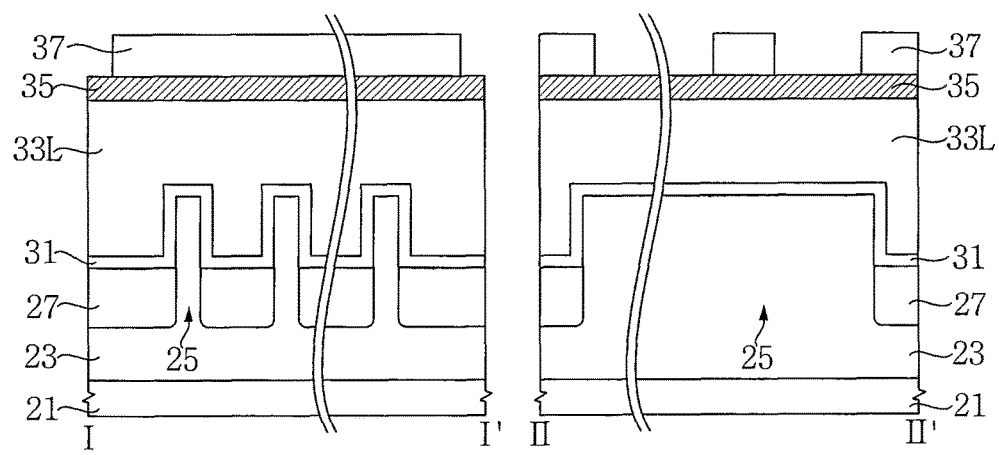

Referring to FIGS. 1, 2 and 7, a temporary capping pattern 37 partially exposing the first growth-blocking layer 35 may be formed by patterning the temporary capping layer 37L (540).

Figure 8:
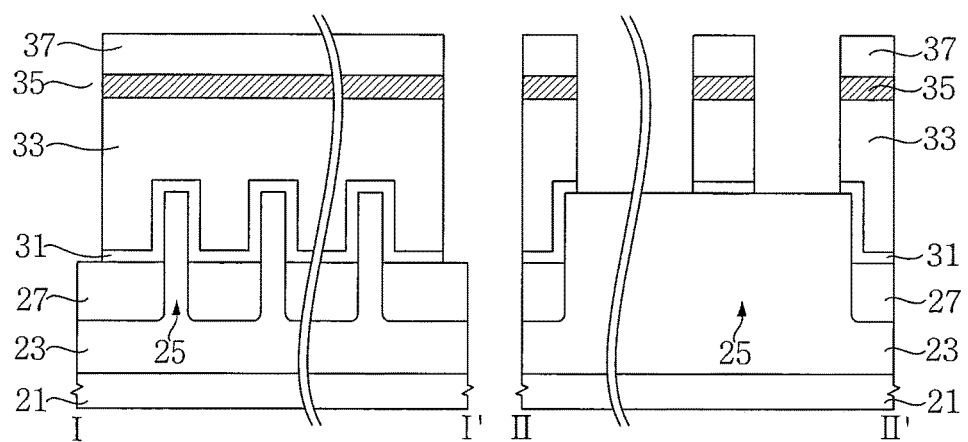

Referring to FIGS. 1, 2 and 8, a temporary gate pattern 33 may be formed by etching the temporary gate layer using the temporary capping pattern 37 as an etch mask (550).

The first growth-blocking layer 35 may remain between the temporary capping pattern 37 and the temporary gate pattern 33. The buffer layer 31 may remain between the temporary gate pattern 33 and the fin active regions 25. The fin active regions 25 may be partially exposed between the temporary gate patterns 33. Sidewalls of the temporary capping pattern 37, the first growth-blocking layer 35, the temporary gate pattern 33, and the buffer layer 31 may be vertically aligned. The first growth-blocking layer 35 may cover the upper surface of the temporary gate pattern 33. Sidewalls of the first growth-blocking layer 35 may be exposed between the temporary gate pattern 33 and the temporary capping pattern 37.

Figure 9:
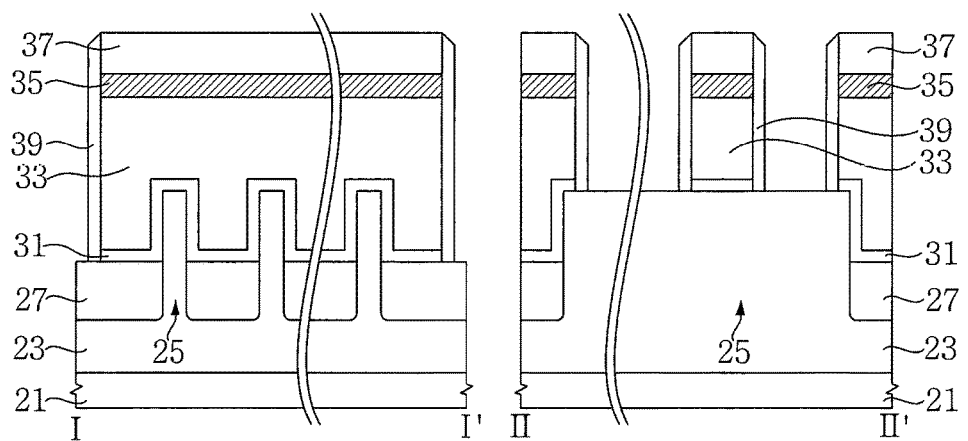

Referring to FIGS. 1, 2 and 9, inner spacers 39 may be formed (560).

The formation of the inner spacers 39 may include forming an insulating layer and performing an anisotropic etching process. For example, the inner spacers 39 may be formed by forming an insulating layer on the substrate 21 on which the temporary capping pattern 37, the first growth-blocking layer 35, the temporary gate pattern 33, and the buffer layer 31 are formed, and by etching back the insulating layer. The insulating layer may include, for example, silicon nitride, silicon oxide, or a combination thereof. The inner spacers 39 may cover sidewalls of the temporary capping pattern 37, the first growth-blocking layer 35, the temporary gate pattern 33, and the buffer layer 31. The fin active regions 25 may be partially exposed between the temporary capping patterns 37 that the inner spacers 39 disposed on the sidewalls thereof.

Referring to FIGS. 1, 2 and 10A, recessed regions 41T may be formed. The recessed regions 41T may be formed by etching the exposed fin active regions 25 using the inner spacers 39, and the temporary capping pattern 37 as an etch mask. The formation of the recessed regions 41T may include an anisotropic etching process, an isotropic etching process, a directional etching process, a cleaning process, or a combination thereof. The fin active regions 25 may be exposed on a bottom surface and sidewalls of the recessed regions 41T. The sidewalls of the recessed regions 41T may be formed below the inner spacers 39. Portions of lower surfaces of the inner spacers 39 may be exposed in the recessed regions 41T.

While forming the recessed regions 41T, sizes of the inner spacers 39 may be reduced. Upper ends of the inner spacers 39 may be disposed at a lower level than a lower surface of the temporary capping pattern 37. For example, upper sidewalls of the first growth-blocking layer 35 may be partially exposed after the recessed regions 41T are formed. The sidewalls of the temporary gate pattern 33 may be covered by the inner spacers 39. The upper ends of the inner spacers 39 may be disposed at a level between the lower surface of the temporary capping pattern 37 and the upper surface of the temporary gate pattern 33. The inner spacers 39 may cover the sidewalls of the temporary gate pattern 33 and lower sidewalls of the first growth-blocking layer 35.

In some embodiments, as illustrated in FIG. 10B, upper ends of the inner spacers 39 formed on an ending portion 33E of the temporary gate pattern 33 may be disposed at a lower level than upper ends of the inner spacers 39 formed on a middle portion of the temporary gate pattern 33. The ending portion 33E of the temporary gate pattern 33 may be disposed in a direction in which the temporary gate pattern 33 crosses the fin active regions 25. The sizes of the inner spacers 39 may be different depending on a density of the temporary gate pattern 33 formed on the substrate 21. For example, the sizes of the inner spacers 39 may be explained by a loading effect. On the ending portion 33E of the temporary gate pattern 33, the inner spacers 39 may cover the sidewalls of the temporary gate pattern 33 and the lower sidewalls of the first growth-blocking layer 35. That is, the upper sidewalls of the first growth-blocking layer 35 may be partially exposed on the ending portion 33E of the temporary gate pattern 33. On the middle portion of the temporary gate pattern 33 in a direction in which the temporary gate pattern 33 crosses the fin active regions 25, the inner spacers 39 may cover the sidewalls of the temporary gate pattern 33 and the first growth-blocking layer 35 and the lower sidewalls of the temporary capping pattern 37.

In some embodiments, as illustrated in FIG. 10C, the inner spacers 39 may cover the sidewalls of the temporary gate pattern 33 and the first growth-blocking layer 35, and the lower sidewalls of the temporary capping pattern 37. The upper ends of the inner spacers 39 may be disposed on the sidewalls of the temporary capping pattern 37.

Referring to FIGS. 1, 11A, 11B, 11C and 11D, a second growth-blocking layer 45 may be formed using a second ion-implantation process (570). The second growth-blocking layer 45 may be locally formed in edges of the first growth-blocking layer 35 and upper corners of the temporary gate pattern 33. It will be understood that the phrase "locally formed" can mean "selectively formed." In some embodiments, the second growth-blocking layer 45 may be selectively formed in edges of the first growth-blocking layer 35 and upper corners of the temporary gate pattern 33.

The second ion-implantation process may include a tilted ion implantation process. An angle of ion implantation applied in the second ion-implantation process may be a combination of a first angle θ1 and a second angle θ2. As illustrated in FIG. 11B, the first angle θ1 may be a horizontal angle formed by an ion-implantation path with respect to a horizontally longitudinal axis of the temporary gate pattern 33. The first angle θ1 may be in the range of 80 to 89 degrees, 91 to 100 degrees, 260 to 269 degrees, 271 to 280 degrees, or a combination thereof. The first angle θ1 may be interpreted as an orientation. As illustrated in FIG. 11C, the second angle θ2 may be a vertical angle formed by the ion-implantation path with respect to a line perpendicular to a surface of the substrate 21. The second angle θ2 may be in the range of 30 to 89 degrees. The second angle θ2 may be interpreted as a tilt.

The second growth-blocking layer 45 may be formed by implanting dopants into the edges of the first growth-blocking layer 35 and the upper corners of the temporary gate pattern 33 by using the second ion-implantation process. The dopants may include As, N, C, O, or a combination thereof. The dopants may be implanted at a dose of 1E13 to 1E16 atoms/cm². Due to the combination of the first angle θ1 and the second angle θ2 and the presence of the temporary capping pattern 37, the dopants are not implanted into the fin active regions 25. A lower end of the second growth-blocking layer 45 may be formed at a lower level than a lower end of the first growth-blocking layer 35. The first growth-blocking layer 35 may be in contact with sidewalls of the second growth-blocking layer 45.

In some embodiments, the lower end of the second growth-blocking layer 45 may be formed at a higher level than the lower end of the first growth-blocking layer 35. The first growth-blocking layer 35 may be in contact with the sidewalls and lower end of the second growth-blocking layer 45.

Figure 11E:
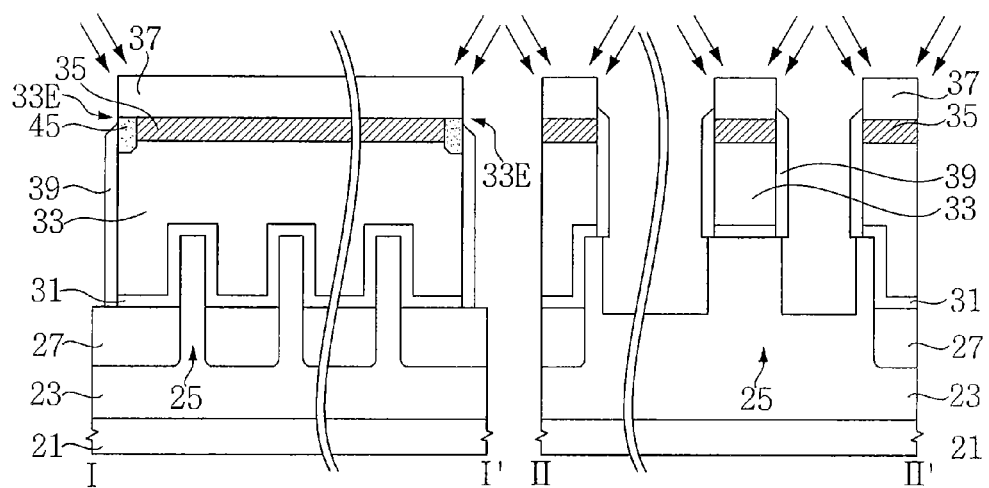

Referring to FIG. 11E, due to the combination of the first angle θ1 and the second angle θ2 and the presence of the temporary capping pattern 37, the second growth-blocking layer 45 may be locally formed at the ending portion 33E of the temporary gate pattern 33. The upper end of the inner spacers 39 may be disposed at a level between an upper end and the lower end of the second growth-blocking layer 45. The inner spacers 39 may cover a lower portion of the second growth-blocking layer 45. The upper end of second growth-blocking layer 45 may be exposed.

Figure 11F:
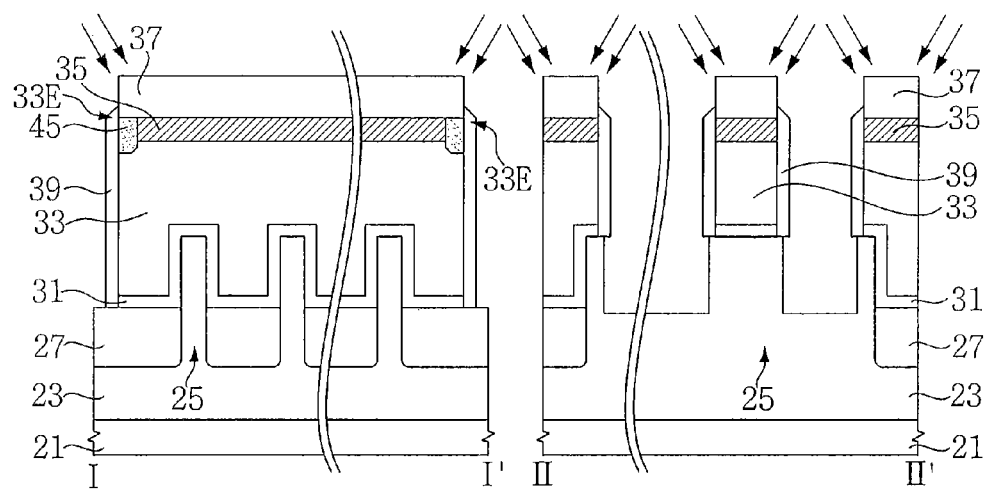

Referring to FIG. 11F, the second growth-blocking layer 45 may be locally formed at the ending portion 33E of the temporary gate pattern 33. The inner spacers 39 may cover the sidewalls of the temporary gate pattern 33, the first growth-blocking layer 35, and the second growth-blocking layer 45, and the lower sidewalls of the temporary capping pattern 37.

Figure 11G:
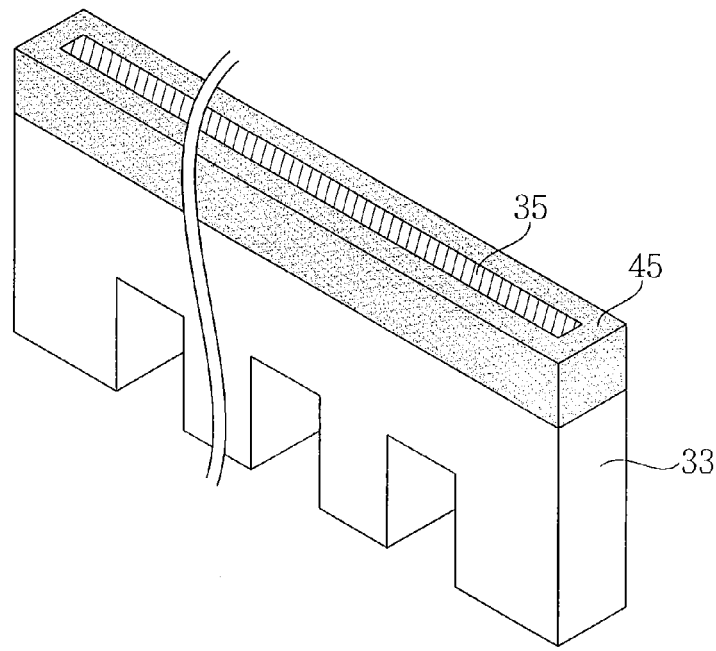
FIGS. 11G, 11H and 11I are perspective views illustrating portions of FIG. 11A.

Referring to FIG. 11G, the second growth-blocking layer 45 may surround the sidewalls of the first growth-blocking layer 35.

Figure 11H:
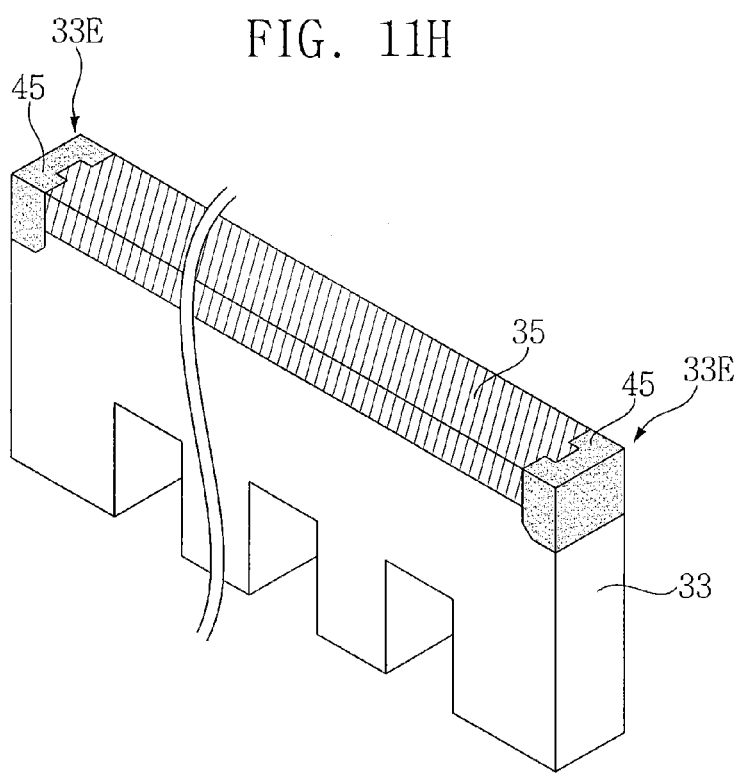

Referring to FIG. 11H, the second growth-blocking layer 45 may be locally formed at both ending portions 33E of the temporary gate pattern 33. For example, the second growth-blocking layer 45 may be formed in upper corners of the ending portions 33E of the temporary gate pattern 33.

Figure 11I:
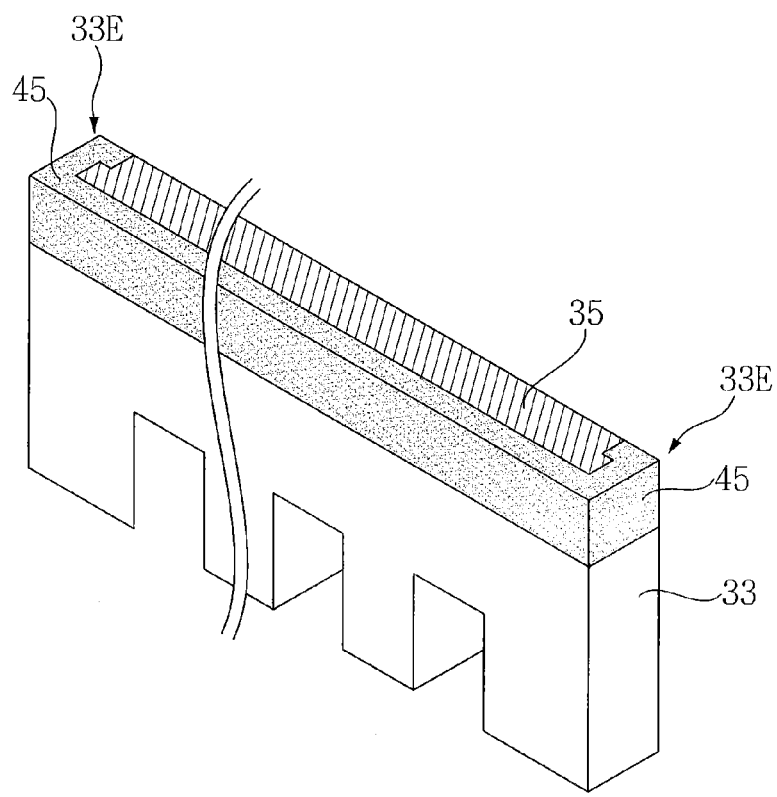

Referring to FIG. 11I, the second growth-blocking layer 45 may be formed at both ending portions 33E of the temporary gate pattern 33 and may be formed in one edge of the temporary gate pattern 33 between the both ending portions 33E. The first growth-blocking layer 35 may remain in the other edge of the temporary gate pattern 33 between the ending portions 33E.

Figure 12:
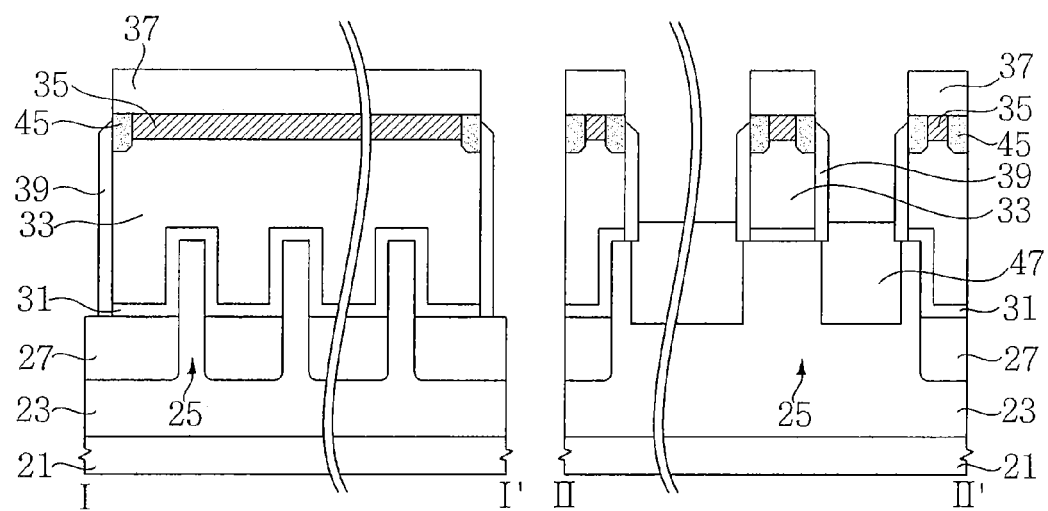
Figure 13:
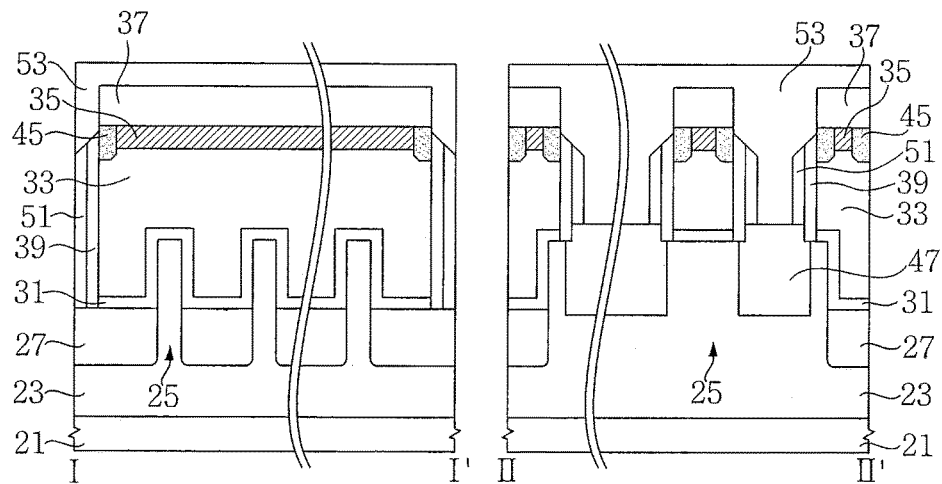

Referring to FIGS. 1, 2 and 12, source/drain regions 47 may be formed (580).

The source/drain regions 47 may be in the recessed regions 41T. In some embodiments, the source/drain regions 47 may fill the recessed regions 41T. The source/drain regions 47 may protrude above the fin active regions 25. Upper ends of the source/drain regions 47 may be disposed at a higher level than upper surfaces of the fin active regions 25. The upper ends of the source/drain regions 47 may be disposed at a higher level than lower ends of the inner spacers 39. The source/drain regions 47 may include a material formed by crystal growth. The source/drain regions 47 may include SiGe, Si, or a combination thereof. The source/drain regions 47 may be elevated source/drain regions. The source/drain regions 47 may serve as stressors. In some embodiments, the source/drain regions 47 may include p-type impurities. The source/drain regions 47 may include B, BF, or a combination thereof. For example, the source/drain regions 47 may include a SiGe layer formed by a selective epitaxial growth (SEG) process. The source/drain regions 47 may contain Ge in the range of about 0 to about 50%.

While forming the source/drain regions 47 using the SEG process, the first growth-blocking layer 35 and the second growth-blocking layer 45 may reduce or prevent generation of defects, such as nodules, caused by the SEG process on the temporary gate pattern 33.

In some embodiments, the source/drain regions 47 may include a lower semiconductor layer, an intermediate semiconductor layer, and an upper semiconductor layer. The lower semiconductor layer may include undoped single crystalline SiGe formed by an SEG process. The lower semiconductor layer may contain Ge in the range of about 10 to about 25%. The lower semiconductor layer may conformally cover inner walls of the recessed regions 41T. The intermediate semiconductor layer may be formed on the lower semiconductor layer. The intermediate semiconductor layer may fully fill the recessed regions 41T. The intermediate semiconductor layer may protrude above the fin active regions 25. The intermediate semiconductor layer may contain B-doped single crystalline SiGe formed by an SEG process. The intermediate semiconductor layer may contain Ge in the range of about 25 to about 50%. The intermediate semiconductor layer may contain B in the range of about 1E20 to about 3E20 atoms/cm$^2$. The upper semiconductor layer may be formed on the intermediate semiconductor layer. The upper semiconductor layer may include B-doped single crystalline Si formed by an SEG process. The upper semiconductor layer may contain B in the range of about 1E20 to about 3E20 atoms/cm$^2$.

In some embodiments, the source/drain regions 47 may include SiC, Si, or a combination thereof. The source/drain regions 47 may include n-type impurities. The source/drain regions 47 may include P, As, or a combination thereof. For example, the source/drain regions 47 may include a SiC layer formed by an SEG process.

Referring to FIGS. 2 to 13, outer spacers 51 and a lower insulating layer 53 may be formed.

The outer spacers 51 may cover sidewalls of the inner spacers 39. Lower ends of the outer spacers 51 may be in contact with upper ends of the source/drain regions 47. The formation of the outer spacers 51 may include forming an insulating layer and performing an anisotropic etching process. The outer spacers 51 may include an insulating layer. The insulating layer may include silicon oxide, silicon nitride, silicon oxynitride, or a combination thereof. For example, the outer spacers 51 may include silicon nitride. In some embodiments, the formation of the outer spacers 51 may be omitted. The lower insulating layer 53 may be formed on the source/drain regions 47. The lower insulating layer 53 may include an insulating layer, such as silicon oxide, silicon nitride, silicon oxynitride, or a combination thereof. For example, the lower insulating layer 53 may include silicon oxide.

Figure 14:
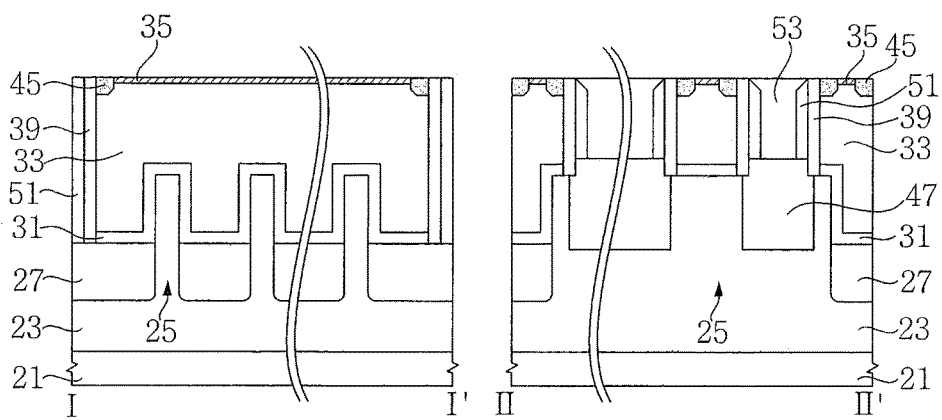

Referring to FIGS. 2 and 14, the temporary capping pattern 37 may be removed to expose the first growth-blocking layer 35 and the second growth-blocking layer 45. The removal of the temporary capping pattern 37 may be performed by a planarization process, such as a chemical mechanical polishing (CMP) process, an etch-back process, or a combination thereof. When the temporary capping pattern 37 is removed, the lower insulating layer 53 may be partially removed. The lower insulating layer 53 may remain on the source/drain regions 47.

In some embodiments, the first growth-blocking layer 35 and the second growth-blocking layer 45 may be completely removed to expose the temporary gate pattern 33.

Figure 15:
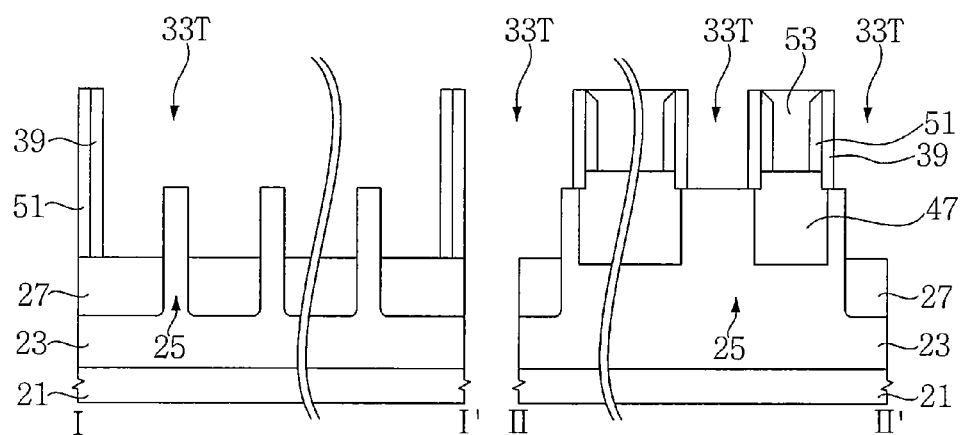

Referring to FIGS. 1, 2 and 15, a gate trench 33T may be formed by removing the first growth-blocking layer 35, the second growth-blocking layer 45, the temporary gate pattern 33, and the buffer layer 31 (590). The upper surfaces and sidewalls of the fin active regions 25 may be exposed in the gate trench 33T.

Figure 16:
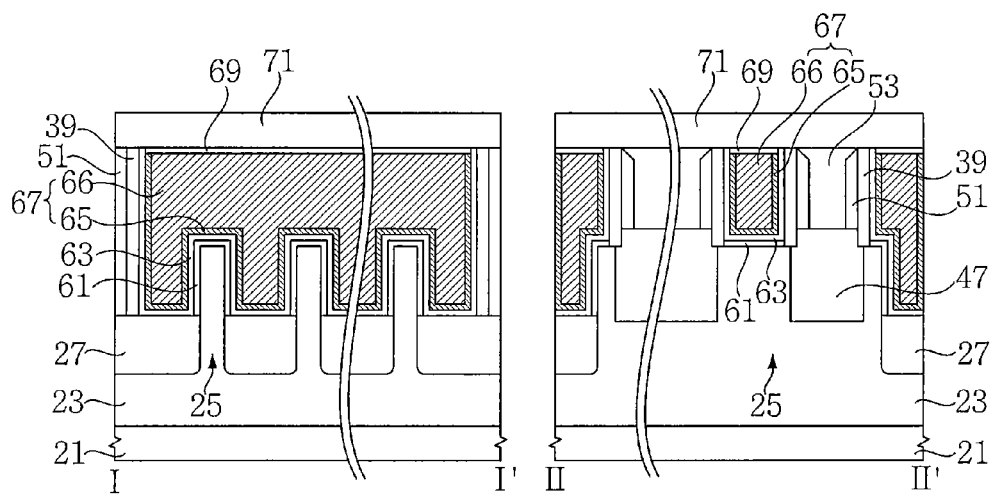

Referring to FIGS. 1, 2 and 16, a first gate dielectric layer 61, a second gate dielectric layer 63, a gate electrode 67, a gate capping pattern 69, and an upper insulating layer 71 may be formed (600). The gate electrode 67 may include a lower gate electrode 65 and an upper gate electrode 66.

The first gate dielectric layer 61 may be formed on the upper surface and sidewalls of the fin active regions 25. The first gate dielectric layer 61 may be formed on the upper surface and sidewalls of the fin active regions 25. The first gate dielectric layer 61 may be referred to as an interfacial oxide layer or a chemical oxide layer. The first gate dielectric layer 61 may be formed using a cleaning process. For example, the first gate dielectric layer 61 may include silicon oxide formed by a chemical reaction of Si and $H_2O_2$.

The second gate dielectric layer 63 may be formed on the first gate dielectric layer 61. The second gate dielectric layer 63 may include silicon oxide, silicon nitride, silicon oxynitride, a high-K dielectric layer, or a combination thereof. For example, the second gate dielectric layer 63 may include HfO or HfSiO.

The lower gate electrode 65 may include a conductive layer in consideration of a work-function. The lower gate electrode 65 may include, for example, TiN, TaN, TiAl, or TiAlC. The upper gate electrode 66 may include a metal layer, a metal silicide layer, a conductive carbon layer, a polysilicon layer, or a combination thereof. The lower gate electrode 65 may surround sidewalls and a bottom surface of the upper gate electrode 66. The second gate dielectric layer 63 may surround sidewalls and a bottom surface of the lower gate electrode 65. The first gate dielectric layer 61 may be interposed between the fin active regions 25 and the second gate dielectric layer 63.

The gate capping pattern 69 may cover the gate electrode 67. The gate capping pattern 69 may include an insulating layer. The insulating layer may include silicon oxide, silicon nitride, silicon oxynitride, or a combination thereof. For example, the gate capping pattern 69 may include silicon nitride layer. The upper insulating layer 71 may include an insulating layer. The insulating layer may include silicon oxide, silicon nitride, silicon oxynitride, or a combination thereof. For example, the upper insulating layer 71 may include silicon oxide.

The generation of nodules on the temporary gate pattern 33 may be reduced or possibly prevented during the process of fabricating a semiconductor device in accordance with some embodiments of the inventive concept. Accordingly, since defects in the shape of the gate electrode 67 are reduced or possibly prevented, the semiconductor device in accordance with some embodiments of the inventive concept may have a significantly improved quality and yield.

Figure 17:
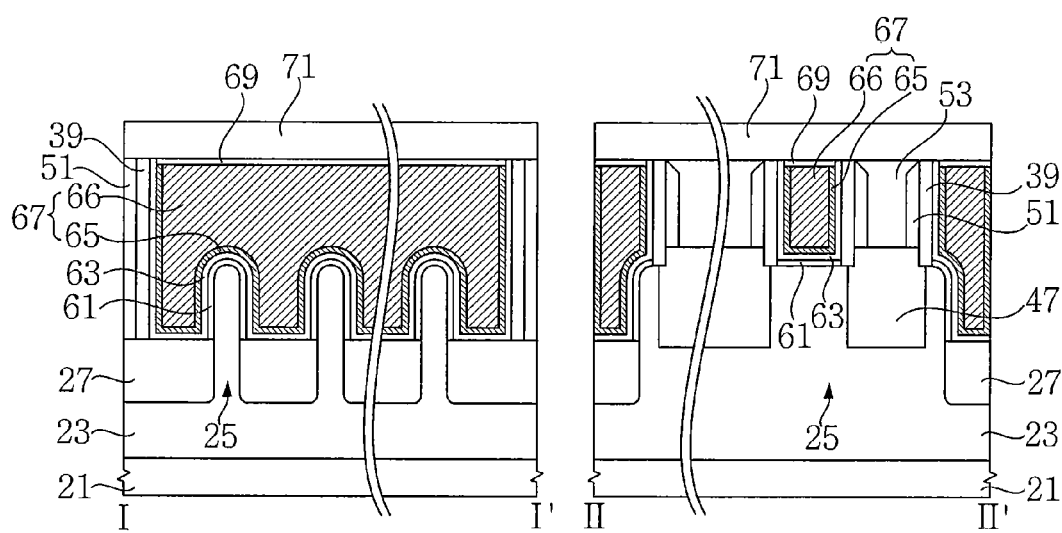

Referring to FIG. 17, the upper surfaces of the fin active regions 25 may be curved. As illustrated in FIG. 2, a plurality of fin active regions 25 may be repeatedly formed on the substrate 21 and spaced apart from each other. A plurality of gate electrodes 67 may be formed in parallel to be spaced apart from each other and may cross the fin active regions 25.

Figure 18:
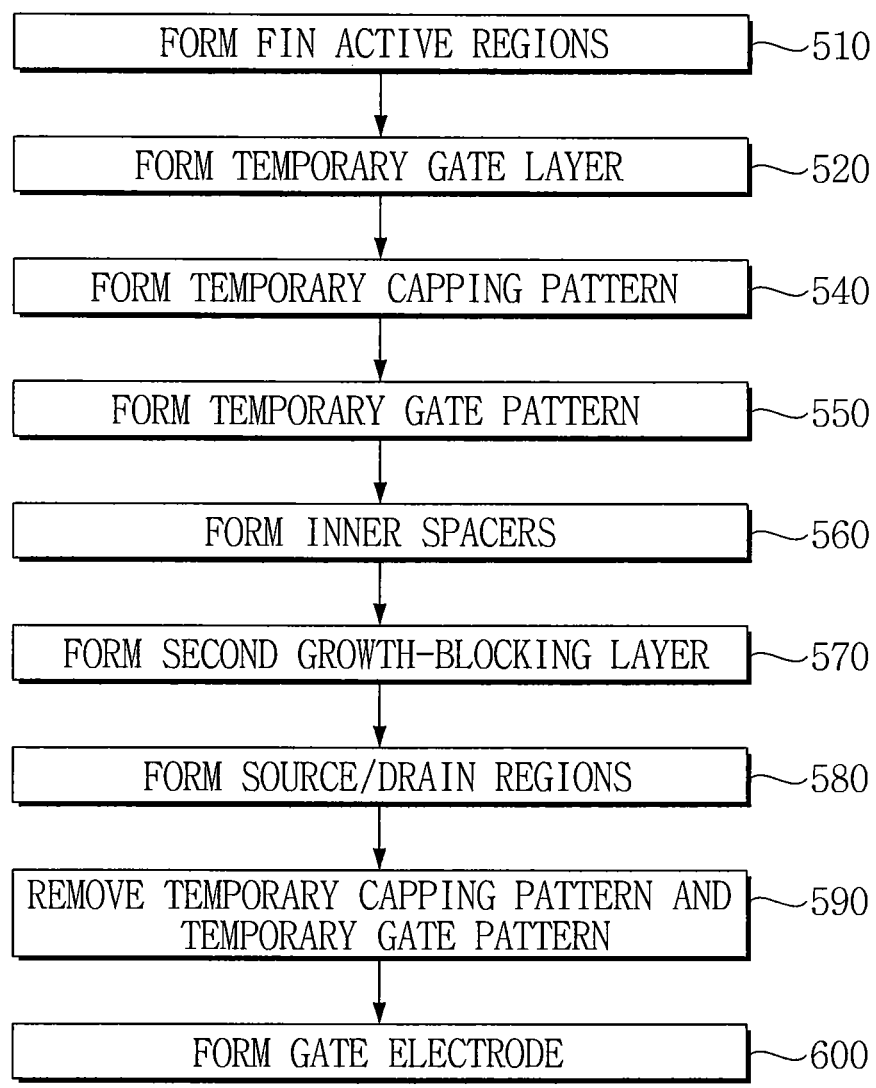
FIG. 18 is a flowchart illustrating a method of forming a semiconductor device in accordance with some embodiments of the inventive concept.

FIG. 18 is a flowchart illustrating a method of forming a semiconductor device in accordance with some embodiments of the inventive concept.

Referring to FIG. 18, the method of forming a semiconductor device in accordance with some embodiments of the inventive concept may include forming fin active regions (510), forming a temporary gate layer (520), forming a temporary capping pattern (540), forming temporary gate pattern (550), forming inner spacers (560), forming a second growth-blocking layer (570), forming a source/drain regions (580), removing a temporary capping pattern and a temporary gate pattern (590), forming a gate electrode (600).

FIGS. 19, 20A, 20B, 20C and 21 are cross-sectional views illustrating a method of forming a semiconductor device in accordance with some embodiments of the inventive concept, which are taken along the lines I-I' and II-II' of FIG. 2. FIGS. 20D, 20E and 20F are perspective views.

Figure 19:
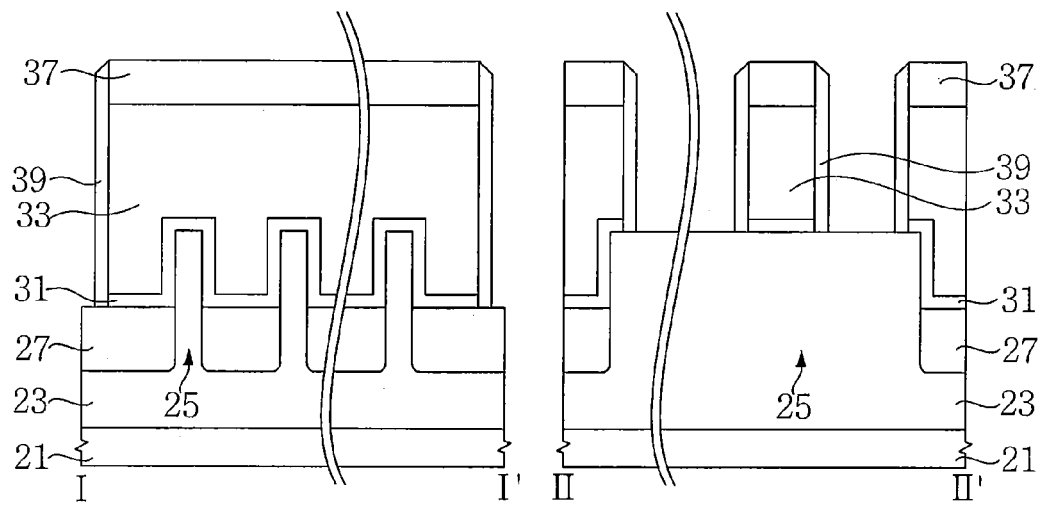
FIGS. 19, 20A, 20B, 20C and 21 are cross-sectional views illustrating a method of forming a semiconductor device in accordance with some embodiments of the inventive concept, which are taken along the lines I-I' and II-II' of FIG. 2.

Referring to FIGS. 18 and 19, temporary capping patterns 37, temporary gate patterns 33, and inner spacers 39 may be formed. A buffer layer 31 may remain between the temporary gate patterns 33 and fin active regions 25. The temporary capping patterns 37 may be in direct contact with the temporary gate patterns 33. The inner spacers 39 may cover sidewalls of the temporary capping patterns 37, the temporary gate patterns 33, and the buffer layer 31. The fin active regions 25 adjacent to sidewalls of the temporary gate patterns 33 may be partially exposed. For example, the fin active regions 25 may be partially exposed between the temporary gate patterns 33 that the inner spacers 39 disposed on the sidewalls thereof.

Figure 20A:
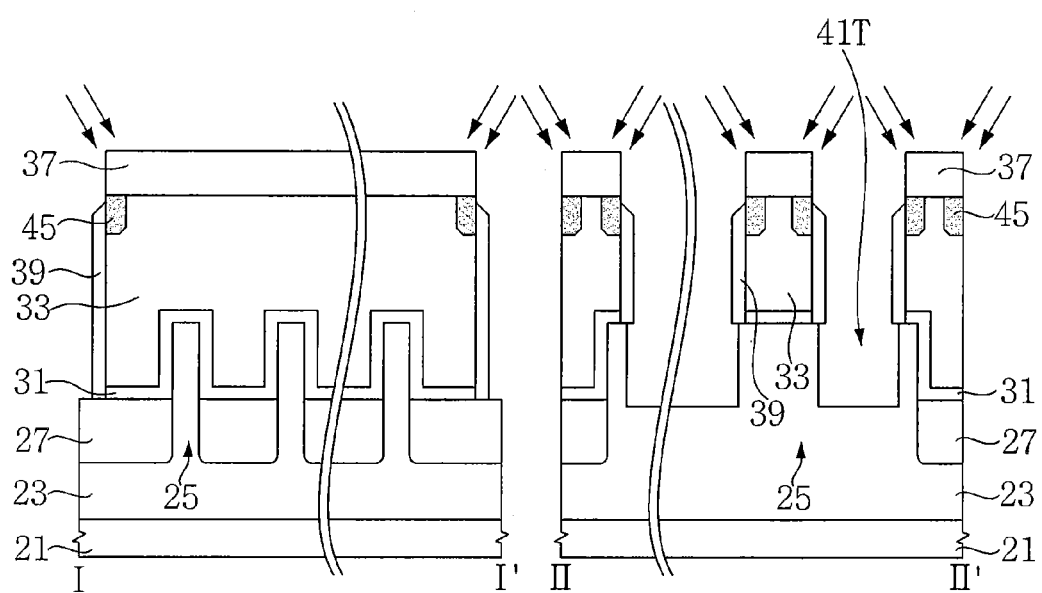

Referring to FIGS. 18 and 20A, the exposed fin active regions 25 may be etched using the inner spacers 39, the temporary capping patterns 37 as an etch mask to form recessed regions 41T. While forming the recessed regions 41T, sizes of the inner spacers 39 may be reduced. After the recessed regions 41T are formed, upper sidewalls of the temporary gate patterns 33 may be partially exposed. Upper ends of the inner spacers 39 may be disposed at a lower level than upper surfaces of the temporary gate patterns 33.

Second growth-blocking layers 45 may be formed using a second ion-implantation process. The second growth-blocking layers 45 may be locally formed in upper corners of the temporary gate patterns 33. The second ion-implantation process may include a tilted ion-implantation process. Lower ends of the second growth-blocking layers 45 may be disposed at a lower level than upper ends of the inner spacers 39. The inner spacers 39 may cover lower portions of the second growth-blocking layers 45.

Figure 20B:
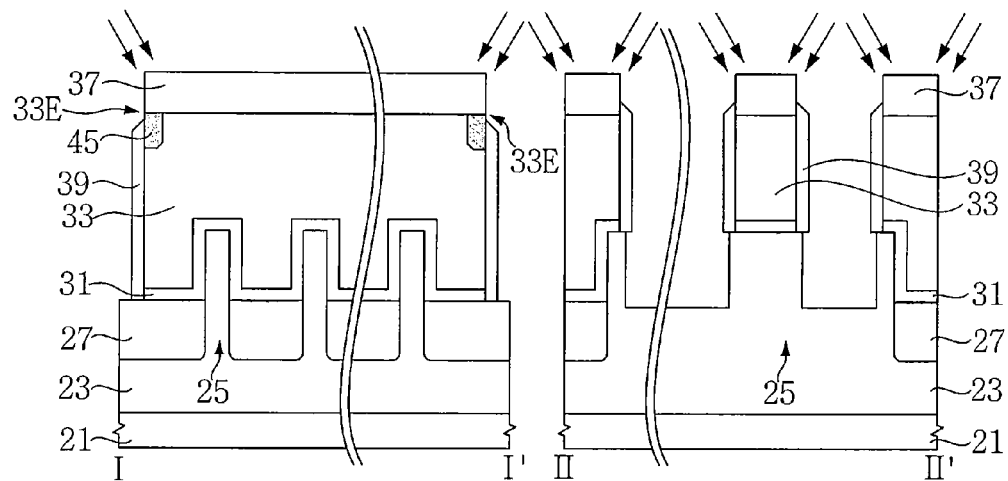

Referring to FIG. 20B, at ending portions 33E of the temporary gate patterns 33, the upper ends of the inner spacers 39 may be disposed at a relatively lower level than middle portions of the temporary gate patterns 33 in a direction in which the temporary gate patterns 33 cross the fin active region 25. The sizes of the inner spacers 39 may be different from each other depending on a density of the temporary gate patterns 33 formed on the substrate 21. At the ending portions 33E of the temporary gate patterns 33, the upper sidewalls of the temporary gate pattern 33 may be partially exposed by the inner spacers 39. At middle portions of the temporary gate patterns 33, the inner spacers 39 may cover the sidewalls of the temporary gate patterns 33 and lower sidewalls of the temporary capping patterns 37.

The second growth-blocking layers 45 may be locally formed at the ending portions 33E of the temporary gate patterns 33. For example, the second growth-blocking layers 45 may be formed in upper edges of the ending portions 33E of the temporary gate patterns 33. The upper ends of the inner spacers 39 may be disposed at a level between upper ends and lower ends of the second growth-blocking layers 45. The inner spacers 39 may cover lower portions of the second growth-blocking layers 45. The upper ends of the second growth-blocking layers 45 may be exposed.

Figure 20C:
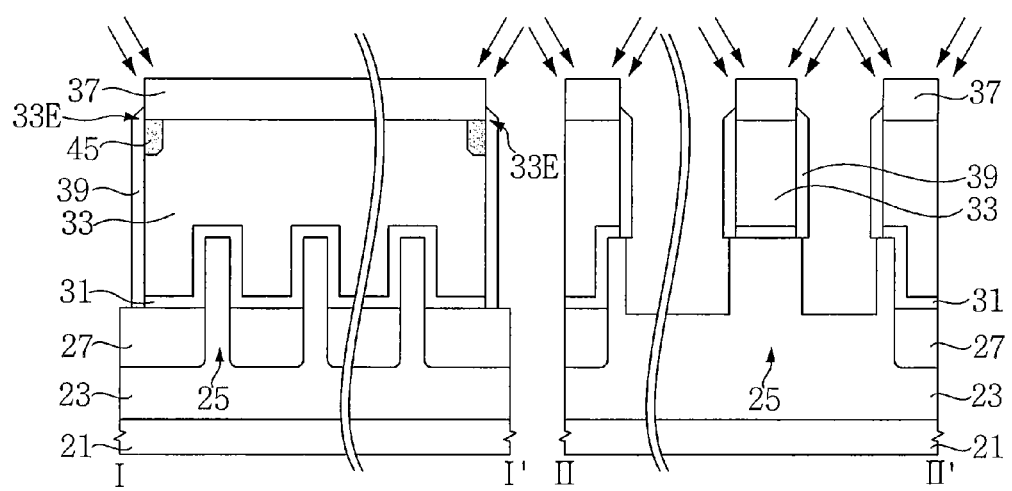
Figure 20D:
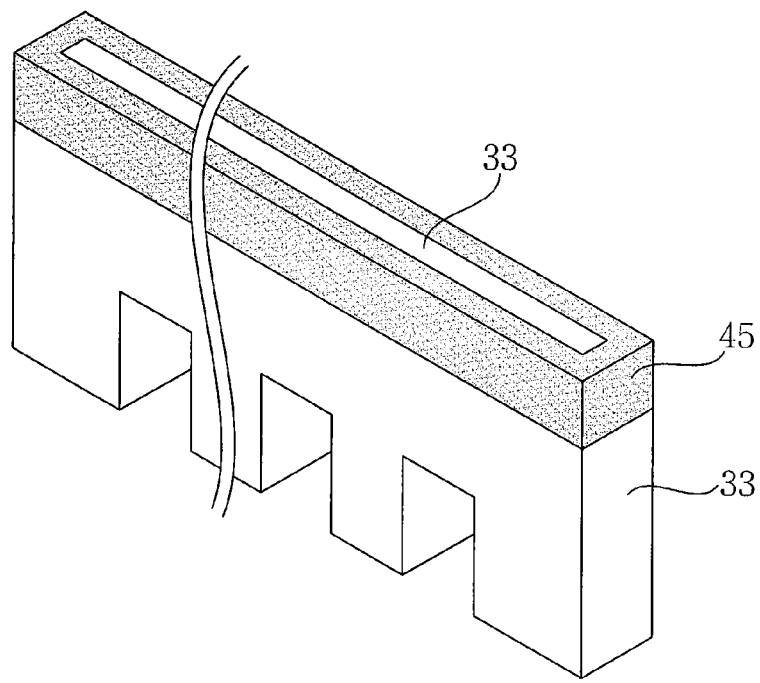
FIGS. 20D, 20E and 20F are perspective views illustrating a method of forming a semiconductor device in accordance with some embodiments of the inventive concept.
Figure 20E:
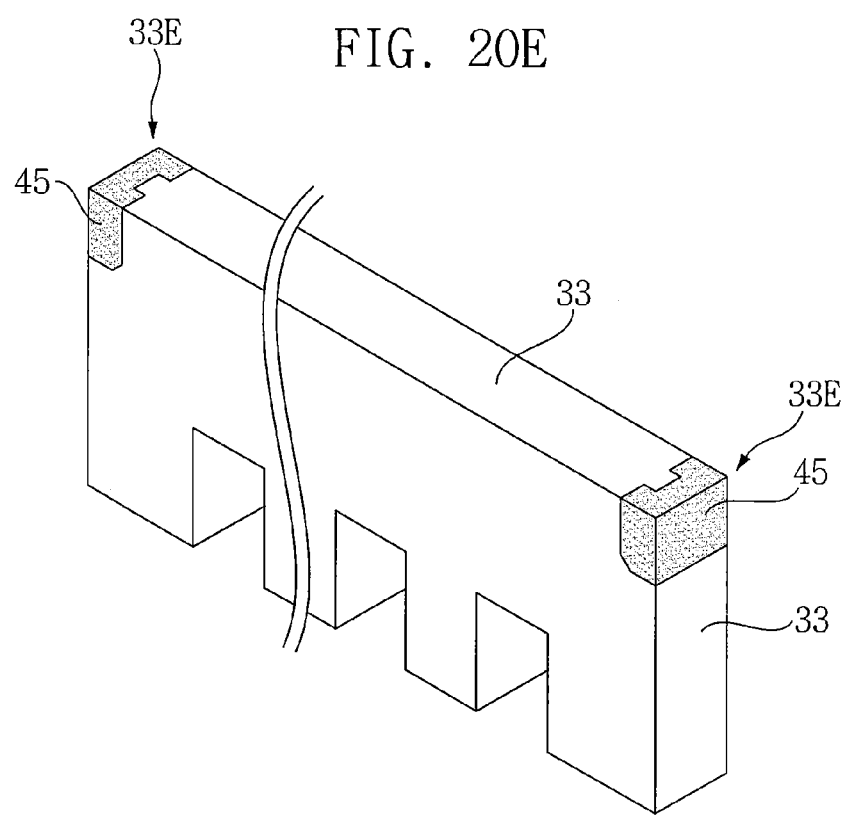
Figure 20F:
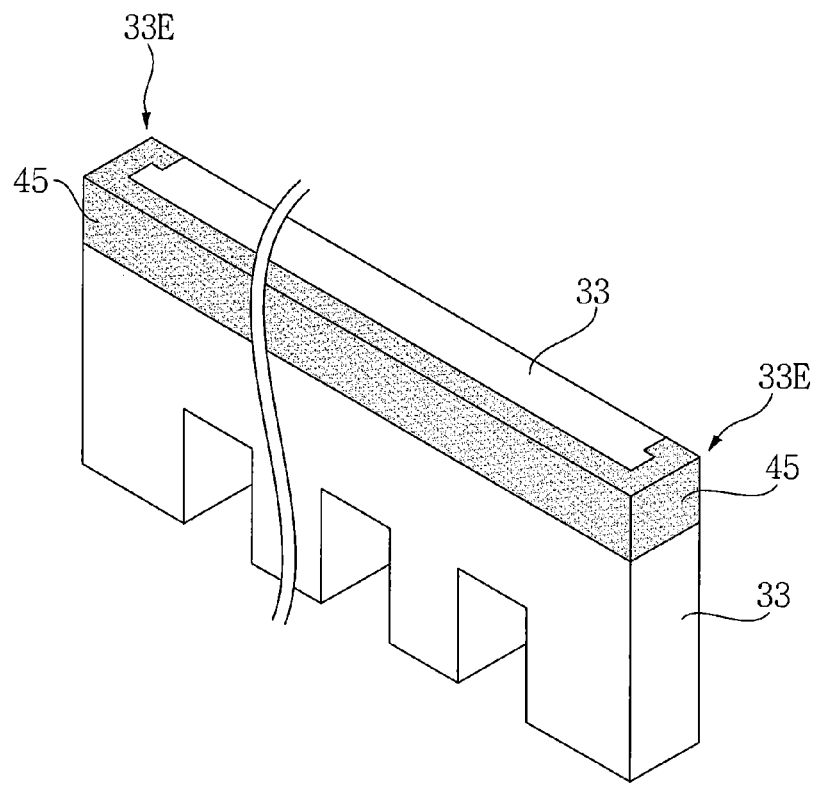

Referring to FIG. 20C, the second growth-blocking layers 45 may be locally formed at the ending portion 33E of the temporary gate pattern 33. The inner spacers 39 may cover sidewalls of the temporary gate pattern 33 and the second growth-blocking layer 45 and lower sidewalls of the temporary capping pattern 37.

Referring to FIG. 20D, the second growth-blocking layer 45 may be locally formed in the upper edge of the temporary gate pattern 33. The second growth-blocking layer 45 may surround an upper portion of the temporary gate pattern 33.

Referring to FIG. 20E, the second growth-blocking layer 45 may be locally formed at the ending portions 33E of the temporary gate pattern 33. The second growth-blocking layer 45 may be formed in the upper edges of the ending portions 33E of the temporary gate pattern 33.

Referring to FIG. 20F, the second growth-blocking layer 45 may be formed at two ending portions 33E of the temporary gate pattern 33, and may be formed in one upper edge between two ending portions 33E of the temporary gate pattern 33. The second growth-blocking layer 45 may not be formed in the other edge between the two ending portions 33E of the temporary gate pattern 33.

Figure 21:
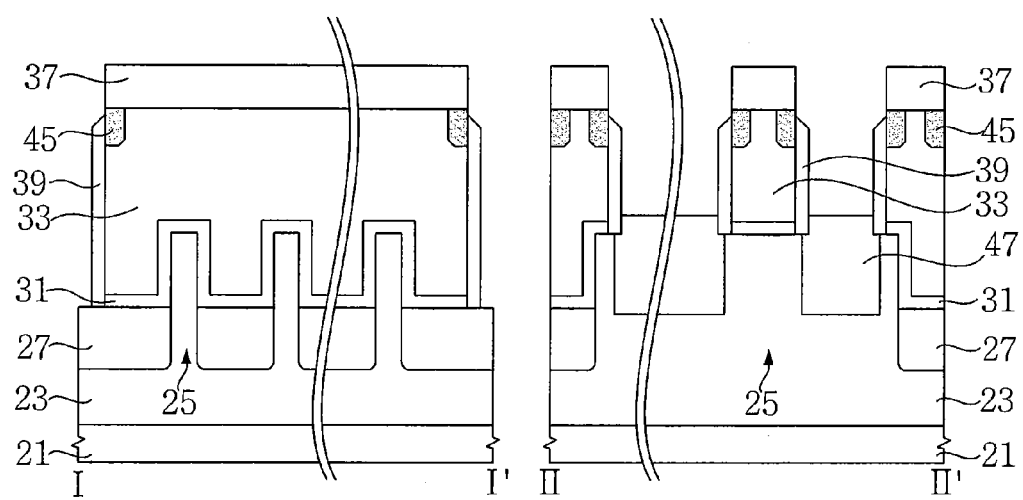

Referring to FIGS. 18 and 21, source/drain regions 47 filling the recessed regions 41T may be formed. The source/drain regions 47 may be elevated source/drain regions. The source/drain regions 47 may serve as stressors. For example, the source/drain regions 47 may include a SiGe layer formed by using an SEG process.

While forming the source/drain regions 47, the second growth-blocking layers 45 may reduce or possibly prevent generation of defects, such as nodules on the temporary gate pattern 33. Next, processes similar to the processes illustrated in FIGS. 13 to 16 may be performed to form the lower insulating layer (e.g., 53 in FIG. 13), to remove the temporary gate patterns 33 and to form the gate electrodes (e.g., 67 in FIG. 16). Accordingly, the nodules may not be formed on the temporary gate patterns 33, and the semiconductor device in accordance with some embodiments of the inventive concept may thus have a significantly improved quality and yield.

Figure 22:
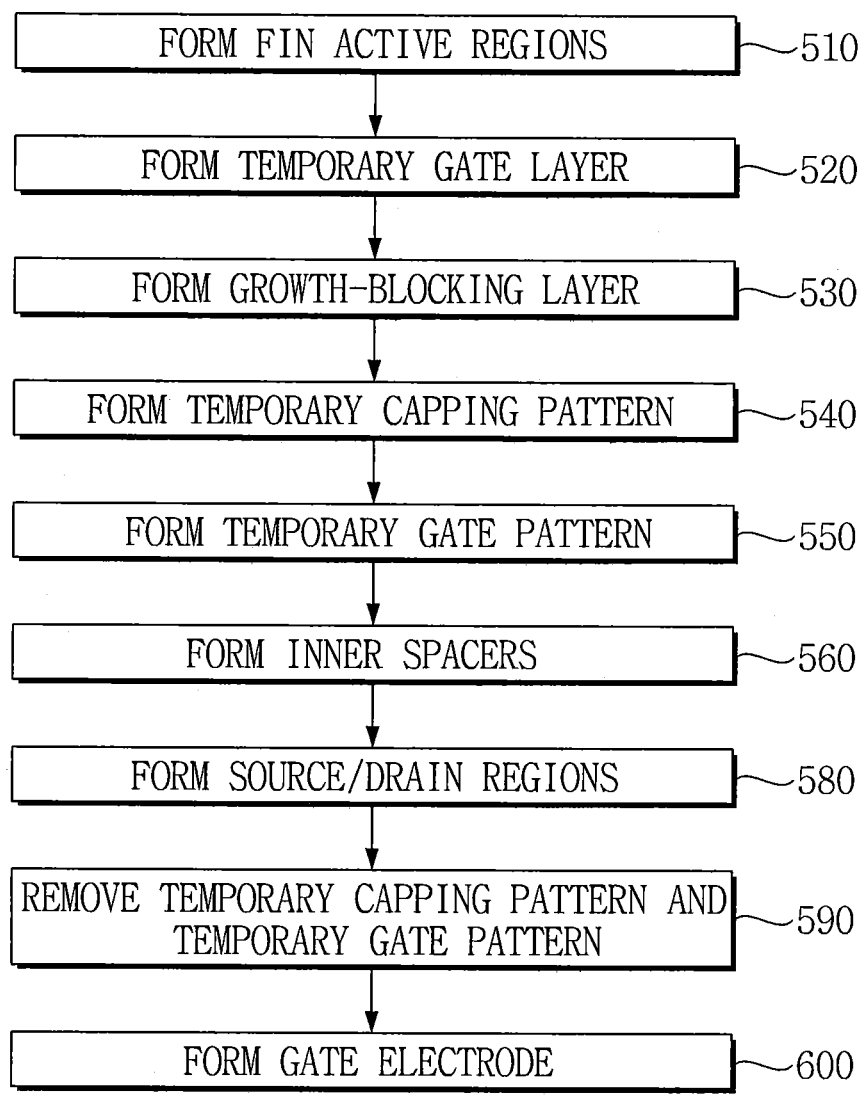
FIG. 22 is a flowchart illustrating a method of forming a semiconductor device in accordance with some embodiments of the inventive concept.

FIG. 22 is a flowchart illustrating a method of forming a semiconductor device in accordance with some embodiments of the inventive concept.

Referring to FIG. 22, a method of forming a semiconductor device in accordance with some embodiments of the inventive concept may include forming fin active regions (510), forming a temporary gate layer (520), forming a first growth-blocking layer (530), forming temporary capping pattern (540), forming temporary gate pattern (550), forming inner spacers (560), forming source/drain regions (580), removing the temporary capping pattern and the temporary gate pattern (590), and forming gate electrode (600).

Figure 23:
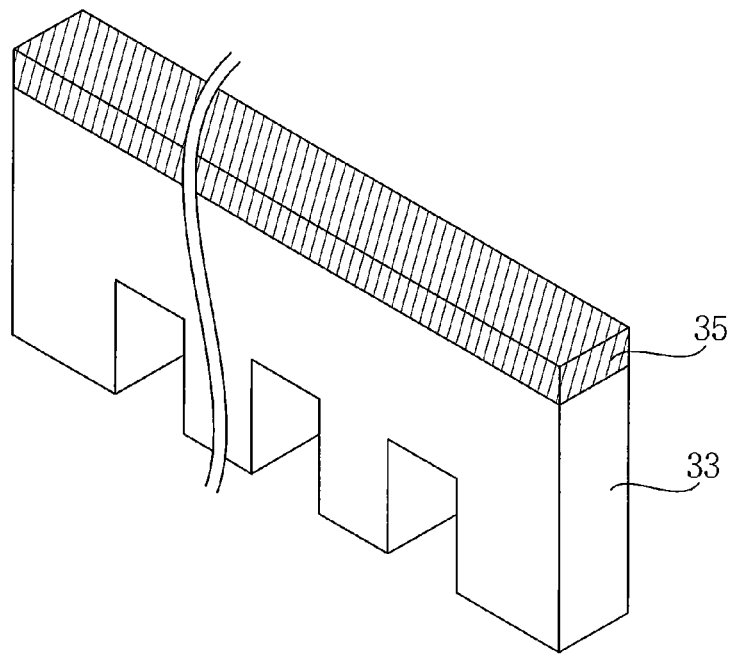
FIG. 23 is a perspective view illustrating a method of forming a semiconductor device in accordance with some embodiments of the inventive concept.
Figure 24:
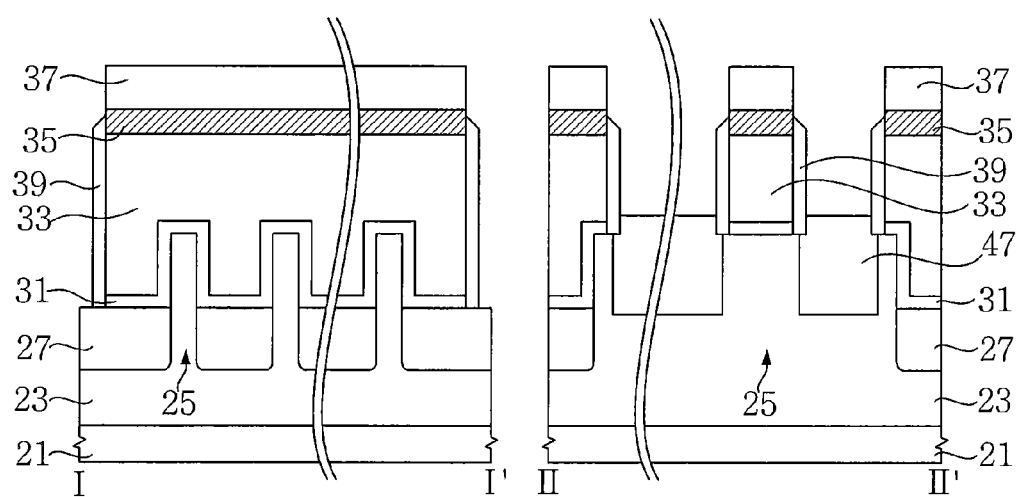
FIG. 24 is a cross-sectional view illustrating the method.

FIG. 23 is a perspective view for describing a method of forming a semiconductor device in accordance with some embodiments of the inventive concept, and FIG. 24 is a cross-sectional view for describing the method.

Referring to FIGS. 22 and 23, a first growth-blocking layer 35 may be formed in an upper portion of a temporary gate pattern 33. The first growth-blocking layer 35 may cover the upper end of a temporary capping pattern 37.

Referring to FIGS. 22 and 24, source/drain regions 47 may be formed. The source/drain regions 47 may be elevated source/drain regions. The source/drain regions 47 may serve as stressors. For example, the source/drain regions 47 may include a SiGe layer formed by using an SEG process.

While forming the source/drain regions 47, the first growth-blocking layer 35 may reduce or possibly prevent generation of defects, such as nodules, on the temporary gate patterns 33. Next, processes similar to the processes illustrated in FIGS. 13 to 16 may be performed to form the lower insulating layer (e.g., 53 in FIG. 16), to remove the temporary gate pattern 33 and to form the gate electrode (e.g., 67 in FIG. 16). Accordingly, the nodules may not be formed on the temporary gate patterns 33, and the semiconductor device in accordance with some embodiments of the inventive concept may thus have a significantly improved quality and yield.

Figure 25:
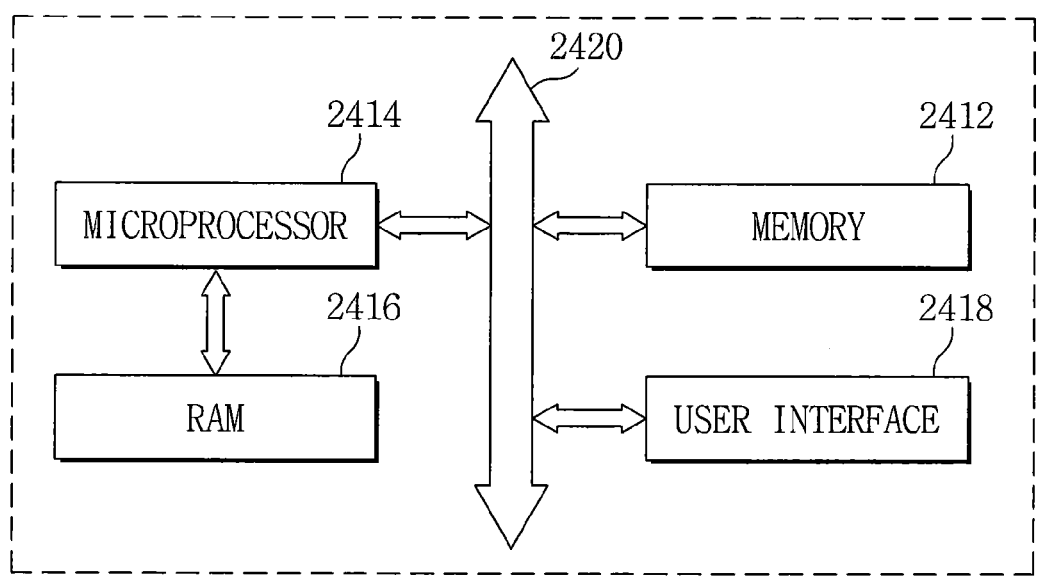
FIG. 25 is a system block diagram of an electronic device according to some embodiments of the inventive concept.

FIG. 25 is a system block diagram showing an electronic system in accordance with some embodiments of the inventive concept.

Referring to FIG. 25, an electronic system 2400 may include at least one of semiconductor devices in accordance with various embodiments of the inventive concept. The electronic system 2400 may be applied to a mobile apparatus or a computer. For example, the electronic system 2400 may include a memory system 2412, a microprocessor 2414, a random access memory (RAM) 2416, a bus 2420, and a user interface 2418. The microprocessor 2414, the memory system 2412, and the user interface 2418 may be interconnected via the bus 2420. The user interface 2418 may be used to input data to or output data from the electronic system 2400. The microprocessor 2414 may program and control the electronic system 2400. The RAM 2416 may be used as an operational memory of the microprocessor 2414. The microprocessor 2414, the RAM 2416, and/or other components can be assembled in a single package. The memory system 2412 may store codes for operating the microprocessor 2414, data processed by the microprocessor 2414, or external input data. The memory system 2412 may include a controller and a memory device.

The semiconductor device described with reference to FIGS. 1 to 24 may be applied to the microprocessor 2414, the RAM 2416, and the memory system 2412.

According to some embodiments of the inventive concept, a first growth-blocking layer and/or a second growth-blocking layer may be formed on a temporary gate pattern. Generation of defects, such as nodules, caused by the SEG process on the temporary gate pattern 33 may be reduced or possibly prevented by the first growth-blocking layer 35 and/or the second growth-blocking layer 45. After the temporary gate pattern is removed, a gate electrode may be formed. Accordingly, quality and yield of a semiconductor device may be significantly improved.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims.

What is claimed is:

1. A method of forming a semiconductor device, comprising:
    forming an active region on a substrate;
    forming a temporary gate crossing the active region and a capping pattern on the temporary gate;
    forming spacers on sidewalls of the temporary gate;
    forming a first growth-blocking layer selectively in a portion of the temporary gate that is adjacent an edge of an upper surface of the temporary gate after forming the spacers;
    forming a source/drain region on the active region adjacent to the temporary gate;
    removing the capping pattern, the first growth-blocking layer, and the temporary gate to expose the active region; and
    forming a gate electrode on the exposed active region.

2. The method of claim 1, wherein the forming of the first growth-blocking layer includes implanting dopants into the temporary gate,
    the temporary gate includes polysilicon, and
    the dopants include As, N, C, O, or a combination thereof.

3. The method of claim 1, wherein the forming of the first growth-blocking layer includes a tilted ion-implantation process, and
    the tilted ion-implantation process is performed by implanting dopants into the temporary gate at an angle which includes a horizontal angle in a range of 80 to 89 degrees, 91 to 100 degrees, 260 to 269 degrees, 271 to 280 degrees, or a combination thereof with respect to a horizontal major axis of the temporary gate, and a vertical angle in a range of 30 to 89 degrees with respect to a line perpendicular to a surface of the substrate.

4. The method of claim 1, wherein the forming of the first growth-blocking layer comprises:
    partially removing the active region after forming the spacers and forming a recessed region; and
    implanting dopants into the temporary gate using a tilted ion-implantation process.

5. The method of claim 1, further comprising forming a second growth-blocking layer in an upper portion of the temporary gate.

6. The method of claim 5, wherein the first growth-blocking layer is in contact with a sidewall of the second growth-blocking layer.

7. The method of claim 5, wherein the first growth-blocking layer surrounds sidewalls of the second growth-blocking layer.

8. The method of claim 5, wherein a lower end of the first growth-blocking layer is disposed at a lower level than a lower end of the second growth-blocking layer.

9. The method of claim 5, wherein the forming of the second growth-blocking layer comprises:
    forming a temporary gate layer on the active region;

forming the second growth-blocking layer in the upper portion of the temporary gate layer using an ion-implantation process;

forming a capping pattern on the second growth-blocking layer; and patterning the temporary gate layer to form the temporary gate, wherein the second growth-blocking layer remains between the capping pattern and the temporary gate after forming the temporary gate.

10. The method of claim 5, wherein the temporary gate includes polysilicon, the second growth-blocking layer includes dopants implanted into the polysilicon, and the dopants include As, N, C, O, or a combination thereof.

11. The method of claim 1, wherein the forming of the source/drain region comprises:

partially removing the active region to form a recessed region before forming the first growth-blocking layer; and forming the source/drain region in the recessed region after forming the first growth-blocking layer.

12. The method of claim 1, wherein the source/drain region is formed after forming the first growth-blocking layer using an epitaxial growth process.

13. A method of forming a semiconductor device, comprising:

defining a fin active region on a substrate;

forming a temporary gate layer on the fin active region;

forming a first growth-blocking layer in an uppermost portion of the temporary gate layer by implanting dopants into the uppermost portion of the temporary gate layer, the dopants including As, N, C, O, or combination thereof;

forming a capping layer on the first growth-blocking layer;

forming a temporary gate structure by sequentially the capping layer, the first growth-blocking layer and the temporary gate layer;

forming spacers on sidewalls of the temporary gate structure;

forming source/drain regions on the fin active region adjacent to sidewalls of the temporary gate structure;

removing the temporary gate structure to expose the fin active region; and forming a gate electrode on the exposed fin active region.

14. The method of claim 13, further comprising forming a second growth-blocking layer in a portion of the first growth-blocking layer adjacent a side of the first growth-blocking layer.

15. The method of claim 14, wherein the second growth-blocking layer is formed in an upper corner of the temporary gate layer.

16. The method of claim 14, wherein the second growth-blocking layer is formed after forming the spacers and before forming source/drain regions, wherein the dopants comprises first dopants, and wherein forming the second growth-blocking layer comprises performing a tilted ion-implantation process to implant second dopants into the portion of the first growth-blocking layer adjacent the side of the first growth-blocking layer, and the second dopants include As, N, C, O, or a combination thereof.

17. The method of claim 13, wherein the source/drain regions are formed using an epitaxial growth process after forming the spacers.

18. The method of claim 17, further comprising partially removing portions of the fin active region to form recesses in the fin active region adjacent the respective sidewalls of the temporary gate structure after forming the spacers, wherein the source/drain regions are formed in the respective recesses.

19. The method of claim 13, wherein forming the first growth-blocking layer comprises implanting the dopants at a dose of about 1E13 atoms/cm$^2$ to about 1E16 atoms/cm$^2$.

20. A method of forming a semiconductor device, comprising:

defining a fin active region on a substrate;

forming a temporary gate layer covering an upper surface and sidewalls of the fin active region;

forming a first growth-blocking layer in an upper portion of the temporary gate layer;

forming a capping pattern on the first growth-blocking layer;

patterning the temporary gate layer and forming a temporary gate, wherein the first growth-blocking layer remains between the capping pattern and the temporary gate;

forming spacers on sidewalls of the temporary gate and the first growth-blocking layer;

forming a recessed region by partially removing the fin active region;

forming a second growth-blocking layer in a portion of the temporary gate that is adjacent an edge of an upper surface of the temporary gate and a portion the first growth-blocking layer that is adjacent a side of the first growth-blocking layer;

forming a source/drain region in the recessed region;

removing the capping pattern, the first growth-blocking layer, the second growth-blocking layer, and the temporary gate to expose the fin active region; and forming a gate electrode on the exposed fin active region.

* * * * *